United States Patent [19]
Nakagawa et al.

[11] Patent Number: 5,378,920
[45] Date of Patent: Jan. 3, 1995

[54] HIGH BREAKDOWN VOLTAGE SEMICONDUCTOR DEVICE

[75] Inventors: Akio Nakagawa, Hiratsuka; Norio Yasuhara, Yokohama, both of Japan

[73] Assignee: Kabushiki Kaisha Toshiba, Kawasaki, Japan

[21] Appl. No.: 85,055

[22] Filed: Jul. 2, 1993

Related U.S. Application Data

[63] Continuation of Ser. No. 642,565, Jan. 18, 1991, Pat. No. 5,241,210, which is a continuation-in-part of Ser. No. 236,746, Aug. 26, 1988, abandoned, which is a continuation-in-part of Ser. No. 161,102, Feb. 26, 1988, abandoned.

[30] Foreign Application Priority Data

| | | |
|---|---|---|
| Feb. 26, 1987 [JP] | Japan | 62-43564 |
| Jul. 29, 1987 [JP] | Japan | 62-189420 |
| Jul. 4, 1988 [JP] | Japan | 63-166403 |

[51] Int. Cl.$^6$ ............................................. H01L 29/74
[52] U.S. Cl. ............................... 257/487; 257/506; 257/509; 257/777
[58] Field of Search ............ 257/487, 506, 509, 520, 257/545

[56] References Cited

U.S. PATENT DOCUMENTS

| | | | |
|---|---|---|---|
| 4,729,008 | 3/1988 | Beasom | 257/524 |
| 4,873,564 | 10/1989 | Beesom | 257/527 |

*Primary Examiner*—Robert P. Limanek
*Assistant Examiner*—Roy Potter
*Attorney, Agent, or Firm*—Oblon, Spivak, McClelland, Maier & Neustadt

[57] ABSTRACT

A high breakdown voltage semiconductor device includes a semiconductor substrate, a first insulating film formed on the semiconductor substrate, a first semiconductor region formed on the first insulating film, a second semiconductor region of a first conductivity type having an impurity concentration higher than that of the first semiconductor region and selectively formed on a surface portion of the first semiconductor region, a third semiconductor region having an impurity concentration lower than that of the second semiconductor region and formed on the surface portion of the first semiconductor region so as to be adjacent to or near the second semiconductor region and a fourth semiconductor region of a second conductivity type having an impurity concentration higher than that of the first semiconductor region and formed on the surface portion of the first semiconductor region so as to be outside the third semiconductor region. A fifth semiconductor region having an impurity concentration lower than that of the second or fourth semiconductor region is formed on a bottom portion of the first semiconductor region. When a reverse bias is applied between the second and fourth semiconductor regions, a depletion layer extends vertically in the first semiconductor region and laterally in the fifth semiconductor region. The applied voltage is divided in both the directions and a high breakdown voltage can be obtained.

14 Claims, 22 Drawing Sheets

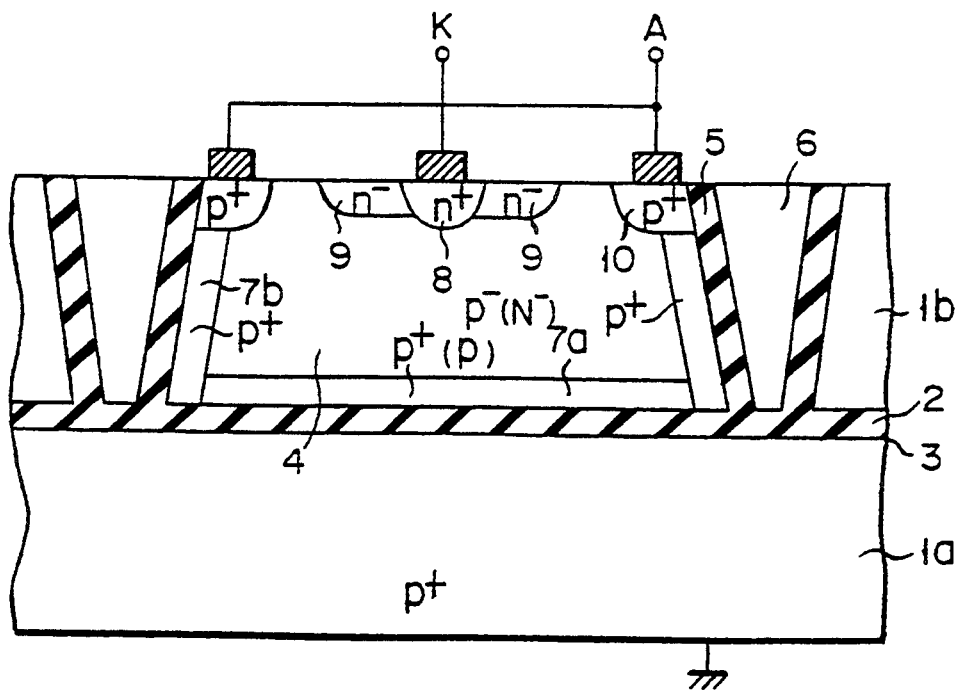
F I G. 2

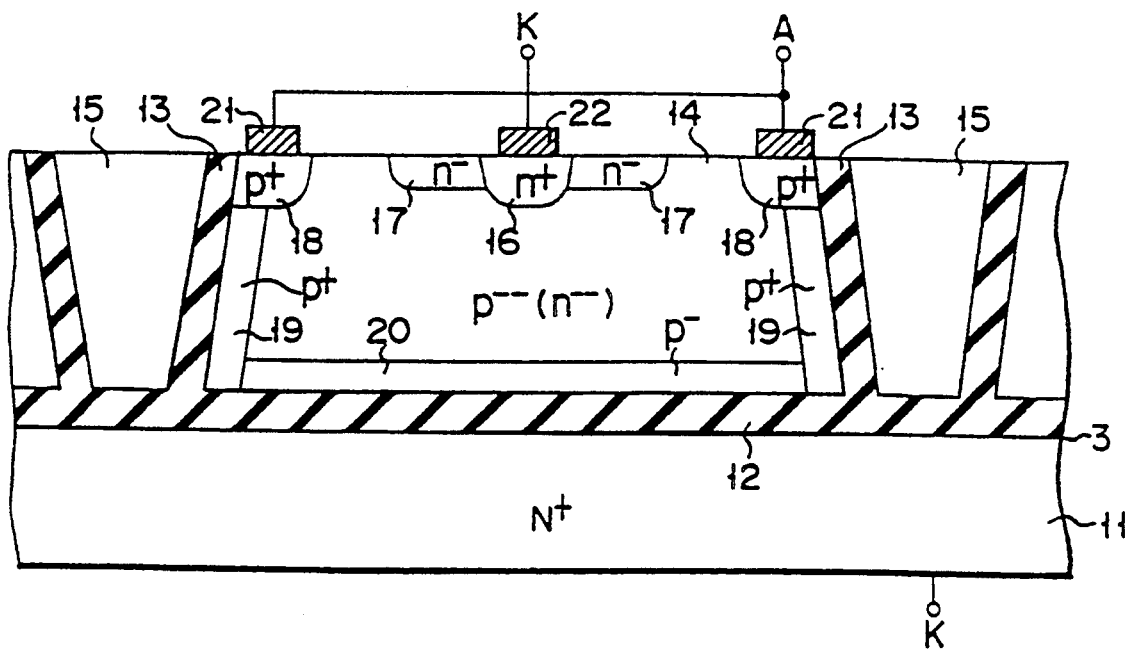
F I G. 3
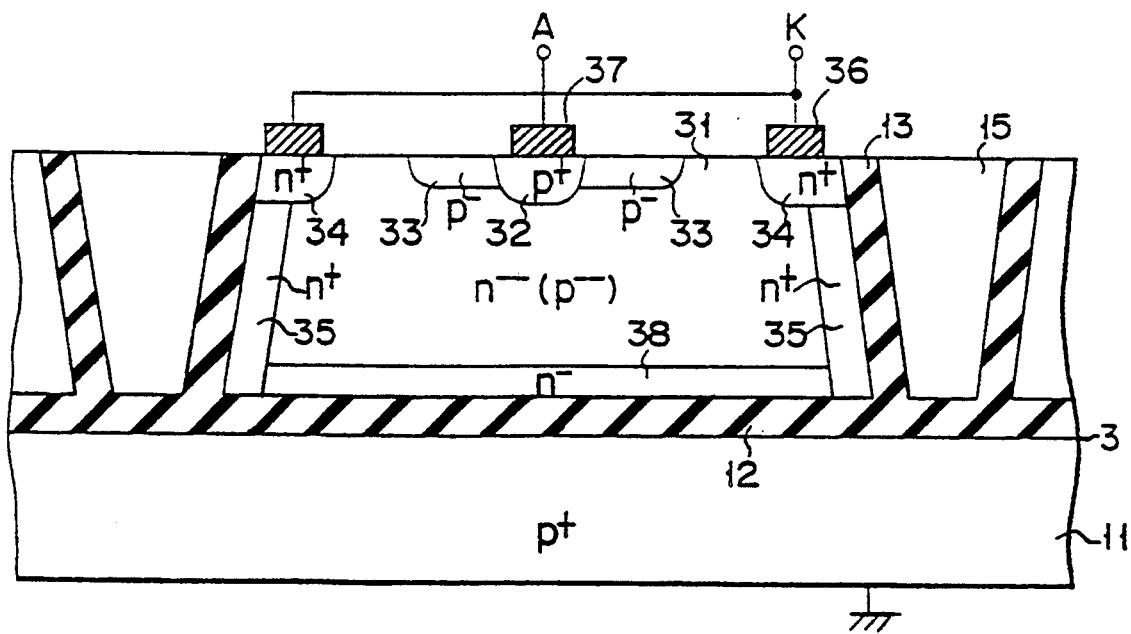
F I G. 4

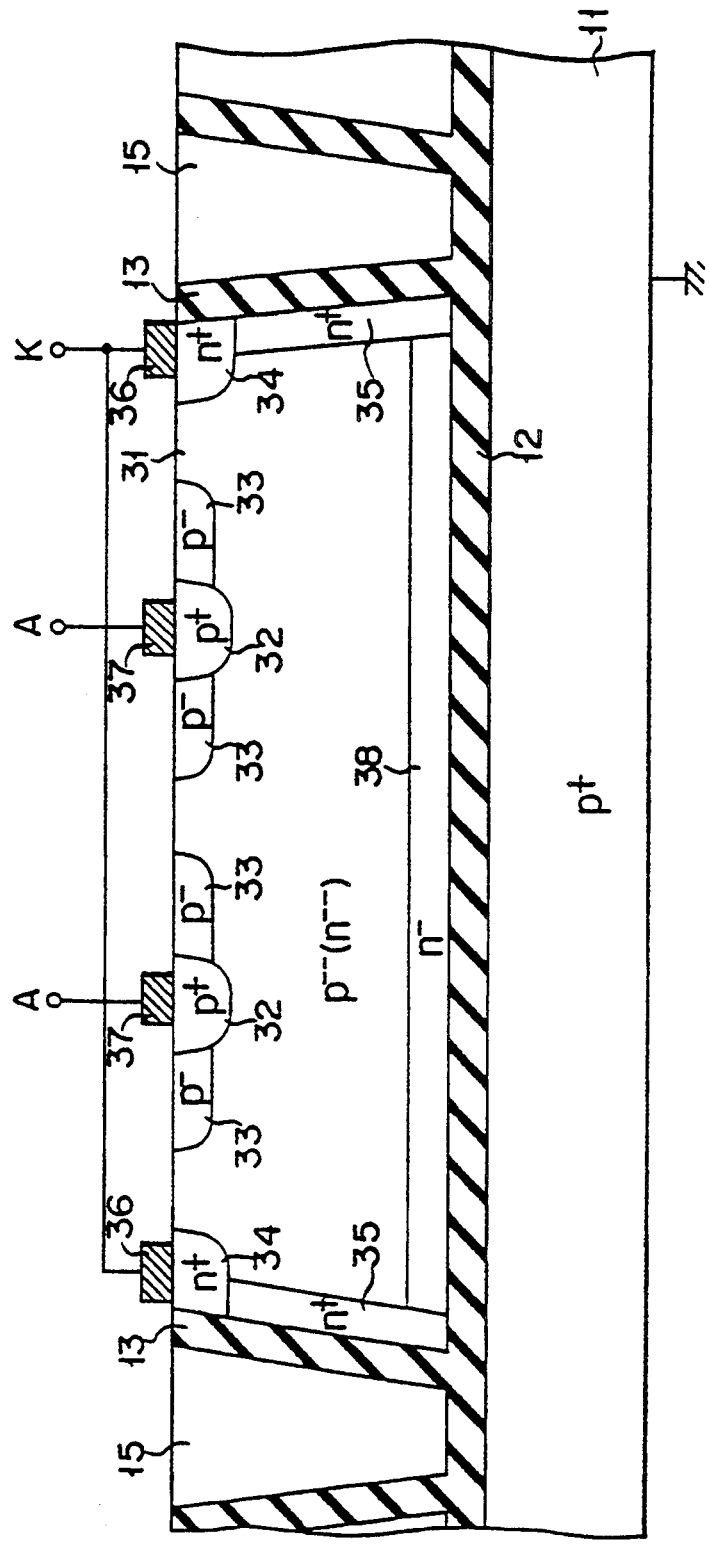
F I G. 12

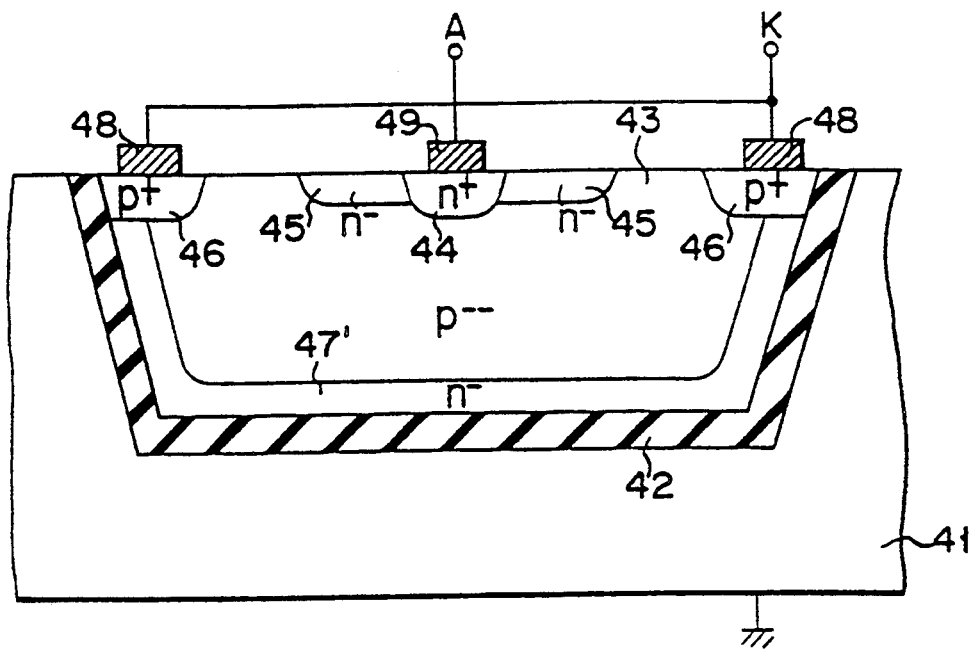
F I G. 15
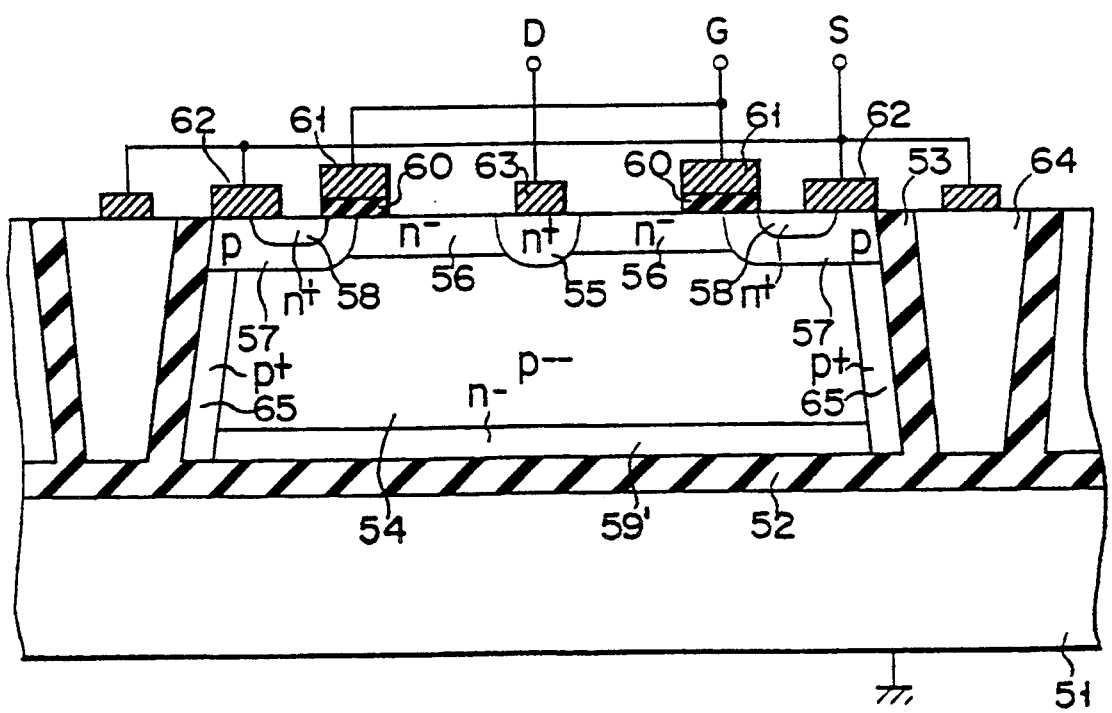
F I G. 16

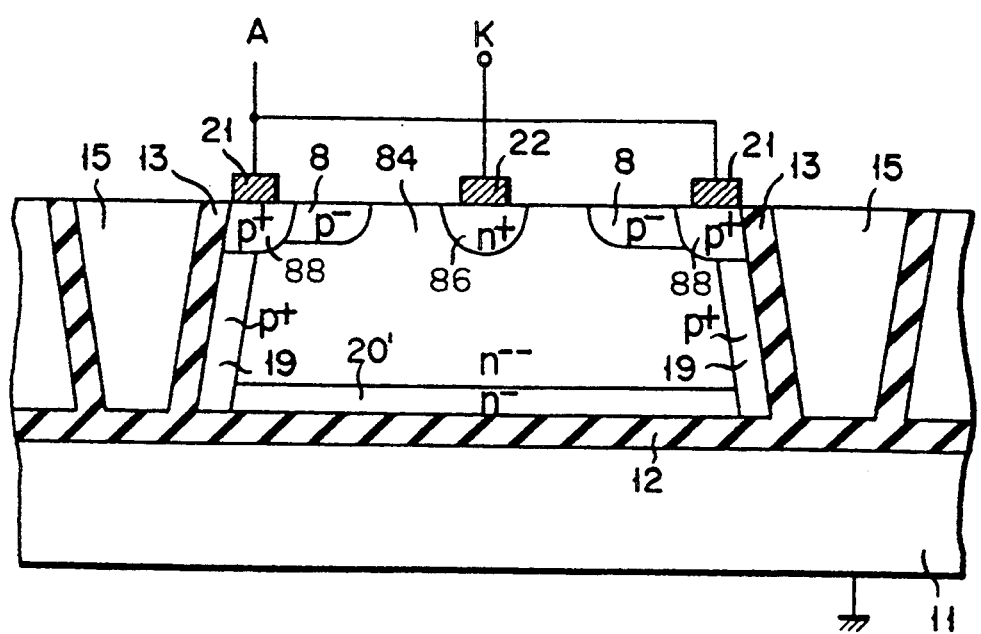
F I G. 19

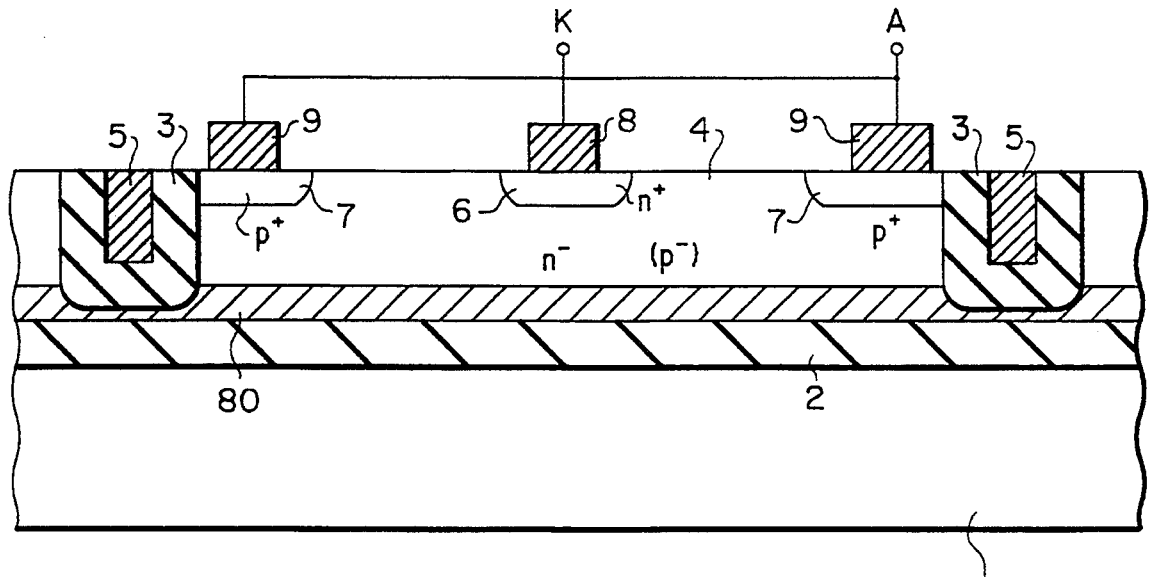
F I G. 34
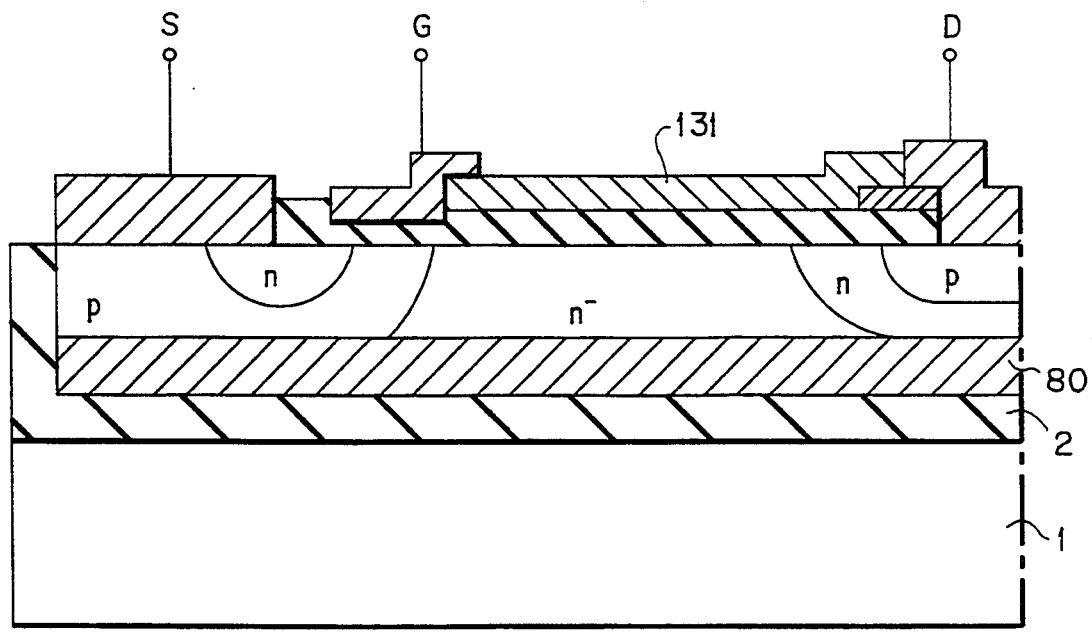
F I G. 35

HIGH BREAKDOWN VOLTAGE SEMICONDUCTOR DEVICE

This application is a continuation of application Ser. No. 07/642,565, now U.S. Pat. No. 5,241,210 filed on Jan. 18, 1991, which was a continuation-in-part of application Ser. No. 07/236,746, filed on Aug. 26, 1988, now abandoned, which was a continuation-in-part of application Ser. No. 07/161,102, filed on Feb. 26, 1988, now abandoned.

BACKGROUND OF THE INVENTION

1. Field of the Invention

The present invention relates to a high breakdown voltage semiconductor device using dielectric isolation.

2. Description of the Related Art

In high breakdown voltage semiconductor devices, a dielectric isolation method is known as an effective method of isolating each element.

FIG. 1 shows a conventional high voltage diode obtained by using such a dielectric isolation method.

Referring to FIG. 1, a Si wafer is obtained by bonding $p^+$-or $n^+$-Si substrate $1a$ and $n^-$-Si substrate $1b$ by a direct bonding technique; 3, a bonding interface, and 2, oxide film formed on bonding interface 3. Part of $n^-$-Si substrate $1b$ of the Si wafer is etched to a depth reaching bonding interface 3 to form a groove, thereby forming island-like $n^-$-layer 4. Oxide film 5 is formed on an inner surface of the groove, and polycrystalline Si film 6 is buried therein. $P^{30}$-layer 8 is formed in a central surface portion $n^-$-layer 4, which has been isolated from other regions by oxide films 2 and 5, and $p^-$-layer 9 is formed around $p^+$-layer 8, thereby constituting a diode. Furthermore, $n^+$-layer 10 is formed in a peripheral surface portion of $n^-$-layer 4 so as to form an anode electrode.

In the diode described above, when a reverse bias is applied between the anode and cathode, a depletion layer extends from $p^+$-layer 8 into $n^-$-layer 4. If the reverse bias is increased, a depletion layer extends from $n^+$-layer and reaches oxide film 2 formed on the bottom of $n^-$-layer 4. The depletion layer cannot extend any longer. Since the potential at substrate $1a$ is normally set at 0 V, the voltage between the anode and cathode is applied to the depletion layer generated in $N^-$-layer 4 and oxide film 2. However, since oxide film 2 is considerably thin and has a high dielectric constant, most of the voltage is applied to the depletion layer. Therefore, in order to sufficiently increase the breakdown voltage of the diode, the thickness of $n^-$-layer 4 must be sufficiently increased. However, if the thickness of $n^-$-layer 4 is increased, the depth of the groove for element isolation must be increased accordingly. This makes it difficult to perform dielectric isolation, especially, in a lateral direction. In addition, if $p^-$-layer 9 formed on the surface is not depleted at the same time when $n^-$-layer 4 is completely depleted, punch-through can be easily caused between $p^-$- and $n^+$-layers 9 and 10.

In addition, a large amount of crystal defects appear which are arranged the grooves. Thus, when transistors are formed in the isolated layer 4, however, many recombinations are caused and life times of carriers are shortened, and therefore, current gain is lowered.

As described above, in a semiconductor element having the conventional dielectric isolation structure, the thickness of a high-resistance semiconductor layer must be sufficiently increased to obtain a sufficiently high breakdown voltage. However, such an arrangement makes it difficult to perform element isolation from the technical viewpoint.

SUMMARY OF THE INVENTION

It is an object of the present invention to provide a high breakdown voltage semiconductor device, in which a sufficiently high breakdown voltage can be obtained even with a thin high-resistance semiconductor layer, and element isolation can be easily performed.

A high breakdown voltage semiconductor device according to the present invention comprises: a semiconductor substrate; a first insulating film formed on the semiconductor substrate; a first semiconductor region formed on the first insulating film; a second semiconductor region of a first conductivity type having an impurity concentration higher than that of the first semiconductor region and selectively formed in a surface portion of the first semiconductor region; a third semiconductor region having an impurity concentration [or impurity dose ($cm^{-2}$)] lower than that of the second semiconductor region and formed in the surface portion of the first semiconductor region so as to be adjacent to or near the second semiconductor region; and a fourth semiconductor region of a second conductivity type having an impurity concentration higher than that of the first semiconductor region and formed in the surface portion of the first semiconductor region so as to be outside the third semiconductor region. The present invention can be characterized in that a fifth semiconductor region having an impurity concentration [or impurity dose ($cm^2$)] lower than that of the second semiconductor region or the fourth semiconductor region is formed on a bottom portion of the first semiconductor region.

Where the third semiconductor region is the first conductivity type, the first and fifth semiconductor regions may be of the first and second conductivity types, respectively. In this case, when a reverse bias is applied between the second and fourth semiconductor regions, a depletion layer extends from the fifth semiconductor region under the second semiconductor region in upward and lateral directions.

In addition, the first and fifth semiconductor regions may be of the second and first conductivity types, respectively. In this case, when a reverse bias is applied between the second and fourth semiconductor regions, a depletion layer extends from the second semiconductor region downward and from a peripheral portion of the fifth semiconductor region in the lateral direction.

Furthermore, both the first and fifth semiconductor regions may be of the second conductivity type. In this case, the first semiconductor region must have an impurity concentration lower than that of the fifth semiconductor region. In such a structure, when a reverse bias is applied between the second and fourth semiconductor regions, a depletion layer extends from the second semiconductor region downward, reaches the fifth semiconductor region, and then laterally extends through the fifth semiconductor region.

The first insulating film has a thickness of, preferably at least 2 $\mu m$.

According to the semiconductor device of the present invention, when a reverse voltage is applied between the second and fourth semiconductor regions, a depletion layer extends into the first, third, and fifth semiconductor regions. A total amount of impurity per unit area of each of the third and fifth semiconductor regions is set to be substantially the same in a region where the third and fifth semiconductor regions overlap each other when viewed from the above. Then, if the total impurity amount (dose) of each layer is set to be at most $3 \times 10^{12}/cm^2$, preferably $0.1 \times 10^{12}$ to $3 \times 10^{12}/cm^2$, more preferably $0.5 \times 10^{12}$ to $2 \times 10^{12}/cm^2$, the third and fifth semiconductor regions are simultaneously depleted. At this time, the voltage applied between the second and fourth semiconductor regions is divided in the vertical and lateral directions by the completely-depleted first, third, and fifth semiconductor regions. Therefore, as opposed to the conventional structure wherein most of the applied voltage is biased in the vertical direction of the first semiconductor region, even if the first semiconductor region is thin, the maximum electric field can be suppressed below a value at which avalanche breakdown occurs.

If the fifth semiconductor region is not completely depleted, the element does not essentially differ from the conventional element in FIG. 1, even if the first and third semiconductor regions are completely depleted. Therefore, the present invention is characterized in that the fifth semiconductor region having a low impurity concentration is inserted in the bottom portion of the first semiconductor region so as to simultaneously deplete the third and fifth semiconductor regions when the reverse bias is applied, as described above. With this arrangement, in the present invention, a breakdown voltage of an element having a dielectric isolation structure can be improved. In addition, if only a breakdown voltage as high as that of the conventional element is required, the thickness of the first semiconductor region can be decreased, thereby facilitating element isolation.

In the embodiment described above, the impurity concentration in the fifth semiconductor region is suppressed at a low level in an attempt to provide a complete depletion in the fifth semiconductor region during operation of the transistor. However, it is possible to increase the impurity concentration in the fifth semiconductor region to some extent. In this case, the breakdown voltage is lower than in the embodiment in which the impurity concentration in the fifth semiconductor region is low. However, the design is facilitated because the potential of the substrate is shielded by the fifth semiconductor region. In this structure, it is desirable to set the dose of ion implantation into the fifth semiconductor region at $5 \times 10^{13}$ to $5 \times 10^{14}/cm^2$. If the dose is unduly low, the fifth semiconductor region is completely depleted during operation of the transistor, resulting in failure to completely shield the potential of the substrate. If the dose is unduly high, the fifth semiconductor region becomes excessively thick. As a result, it is necessary to form a deep groove for isolation in order to obtain a high breakdown voltage.

Note that a third semiconductor layer having a low impurity concentration formed inside a fourth semiconductor layer or outside a second semiconductor layer serves as a guard ring for preventing edge breakdown which occurs because a p-n junction has a curvature on the element surface. A high-resistance film formed between the first and second electrodes or between these electrodes and a gate electrode in place of the third semiconductor layer also effectively prevents the edge breakdown because a small current flows through this portion to produce a substantially uniform potential gradient. When both the third semiconductor layer and the high-resistance film are formed, the edge breakdown can be prevented more effectively.

BRIEF DESCRIPTION OF THE DRAWINGS

FIG. 2 is a sectional view of a diode according to an embodiment of the present invention;

FIG. 3 is a sectional view of a diode according to another embodiment of the present invention;

FIG. 4 is a sectional view of a modification of the diode of FIG. 3 by inverting a conductivity type of each portion of the diode;

Figure 1:
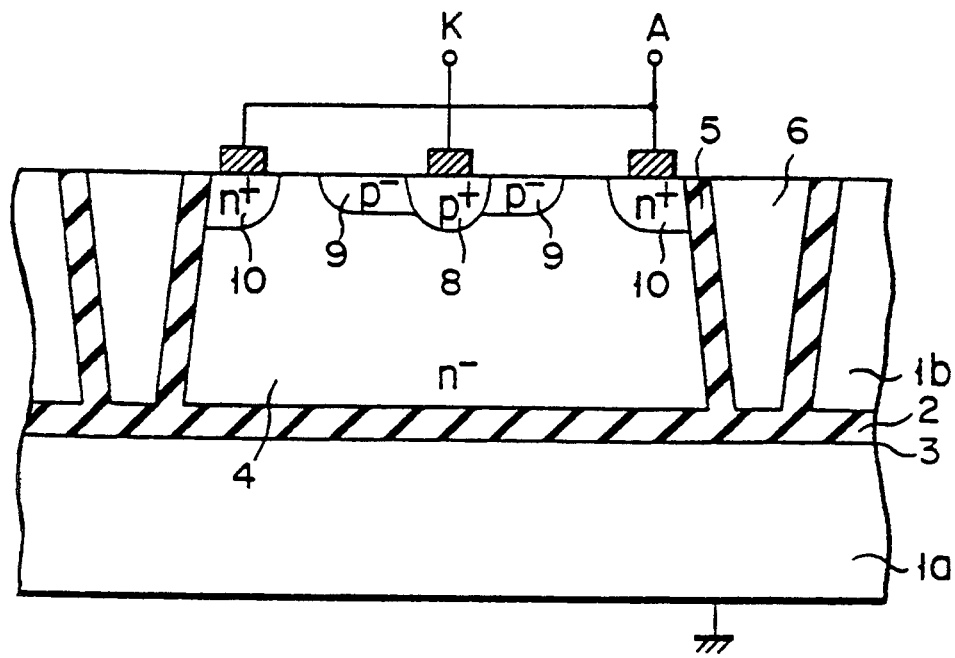
FIG. 1 is a sectional view of a diode having a conventional dielectric isolation structure, respectively.
Figure 5:
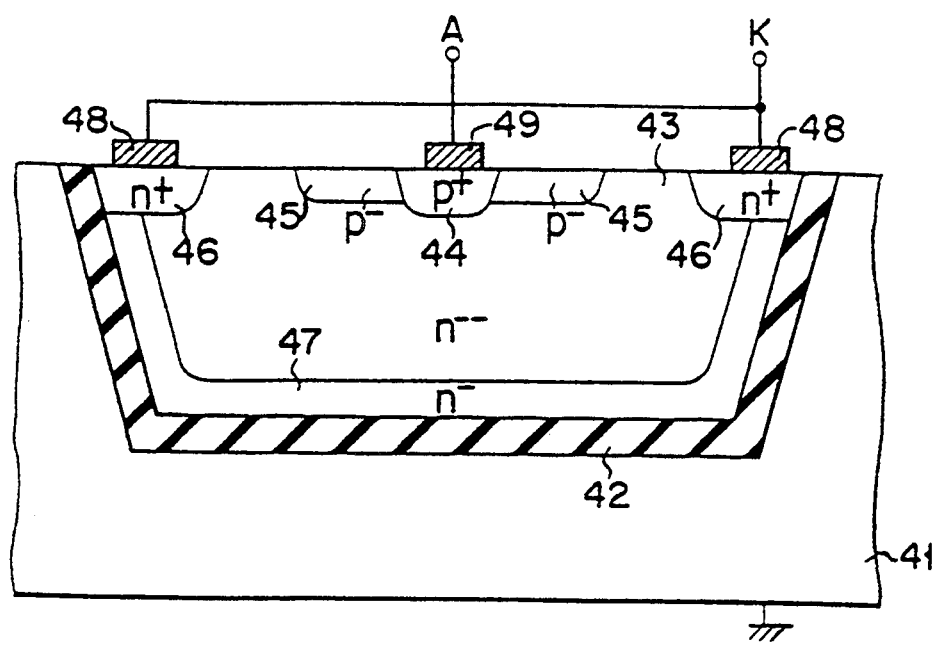
FIG. 5 is a sectional view of a modification of a diode having a dielectric isolation structure different from that of FIG. 3.
Figure 6:
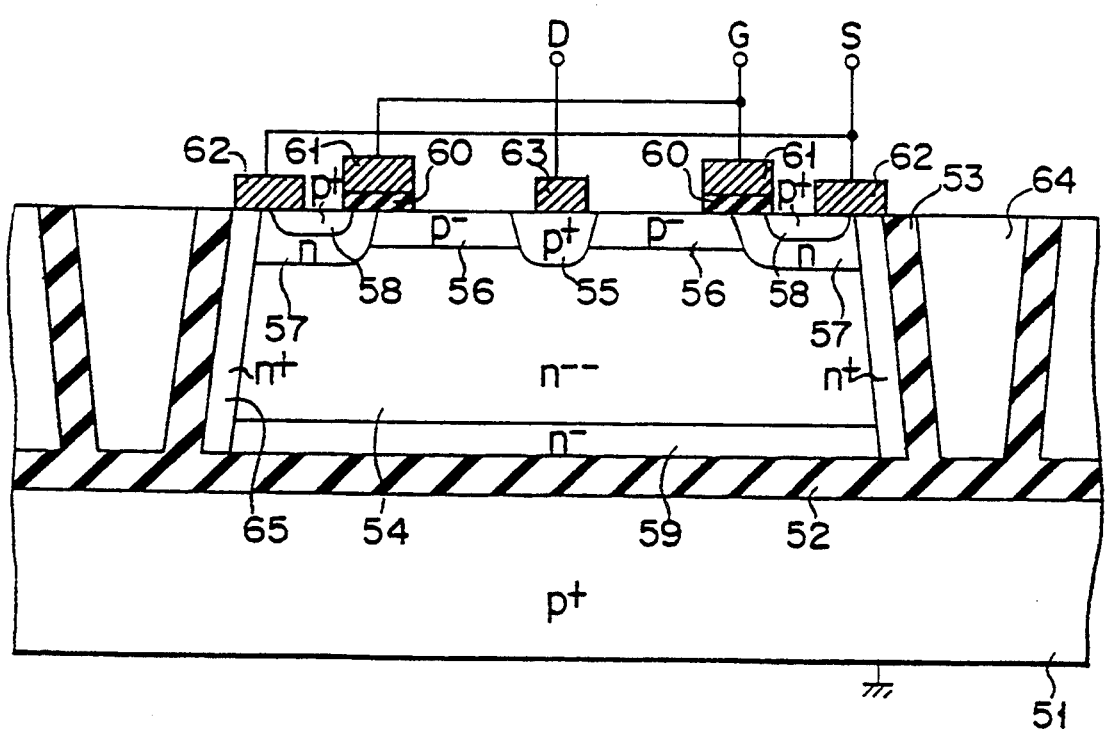
FIG. 6 is a sectional view of a p-channel MOS transistor according to still another embodiment of the present invention.
Figure 7:
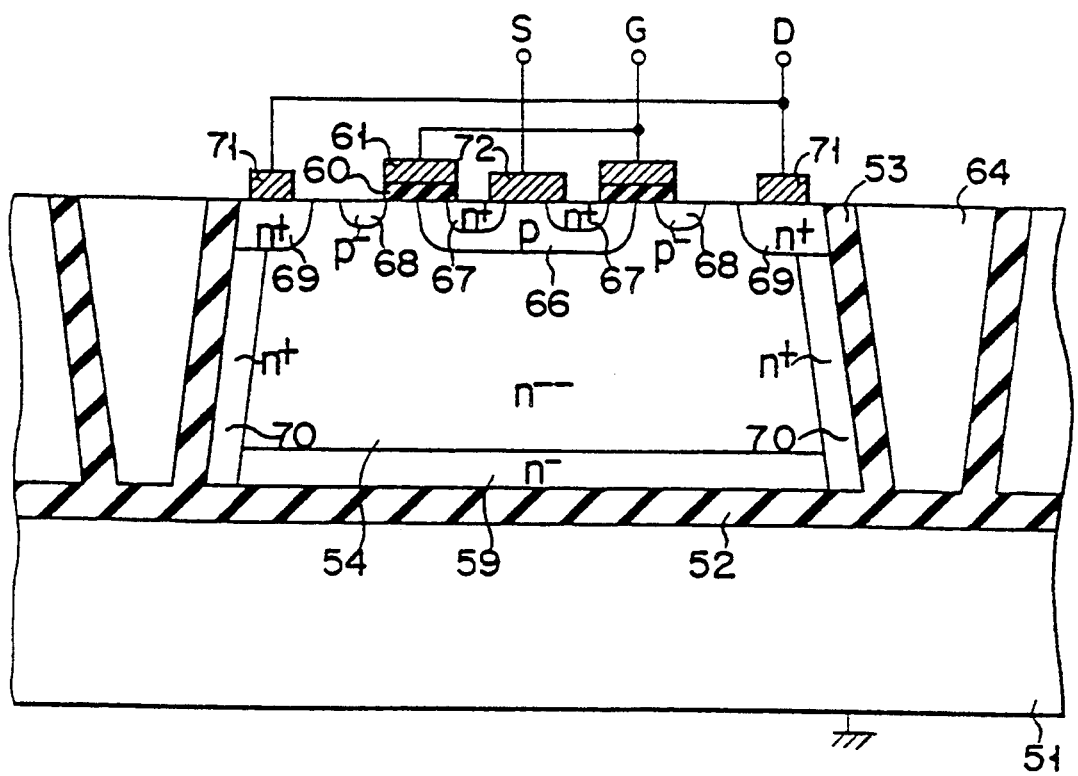
Figure 8:
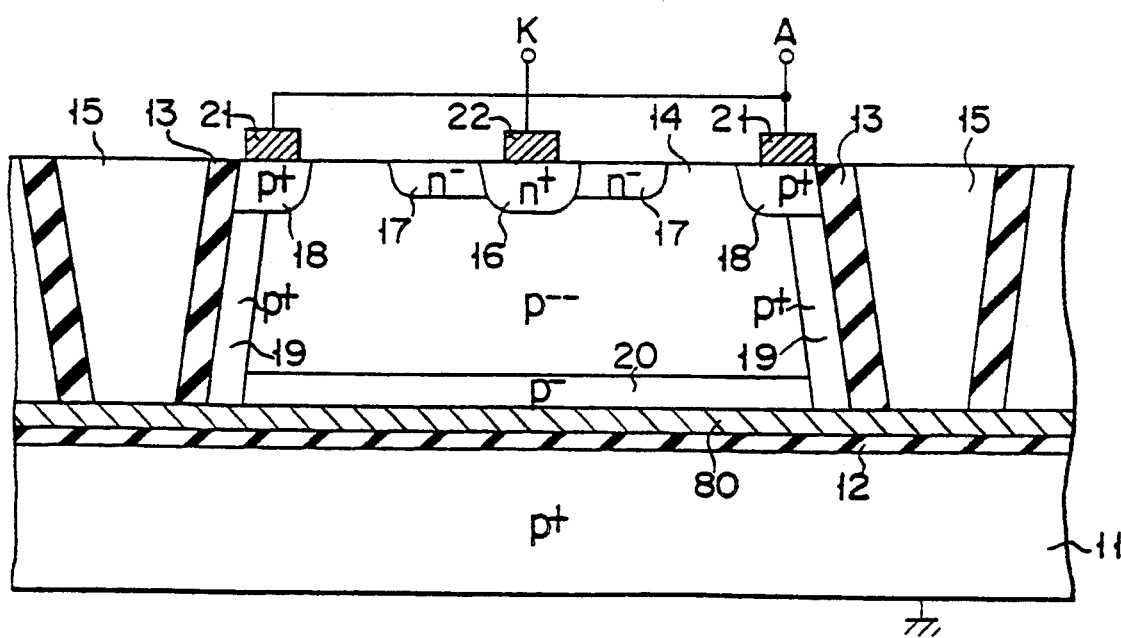
Figure 9:
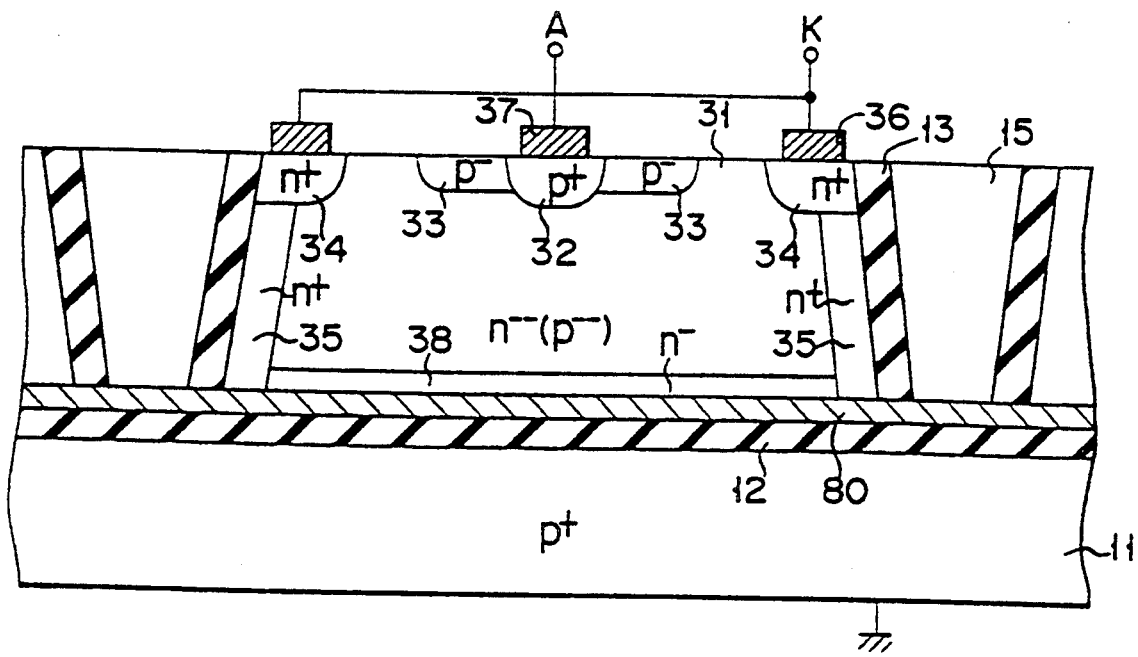
Figure 10:
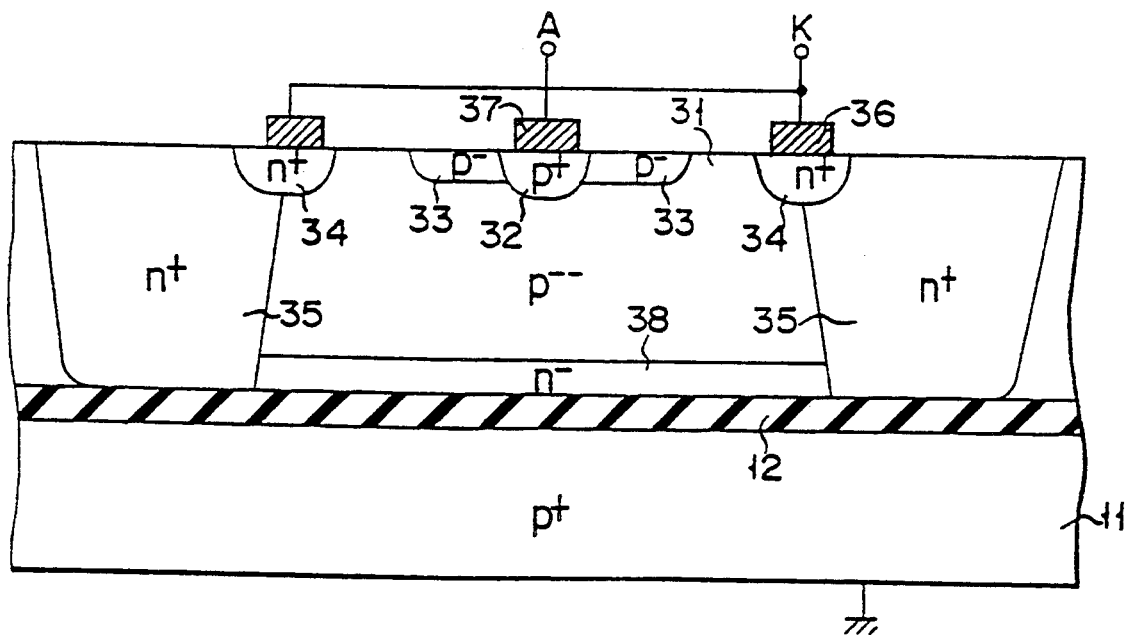
Figure 11:
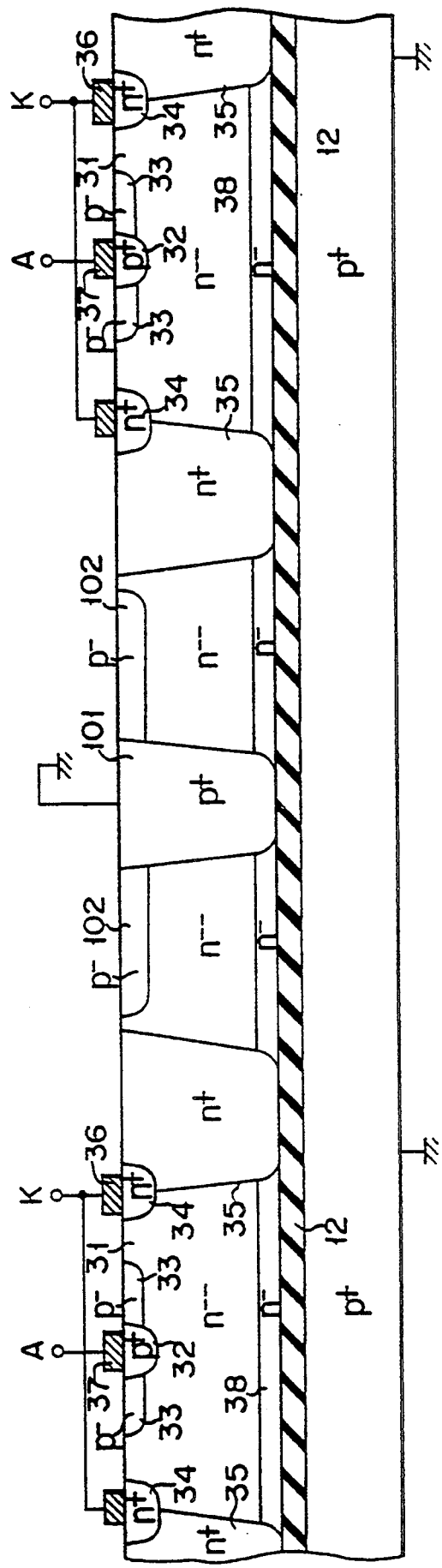
Figure 13:
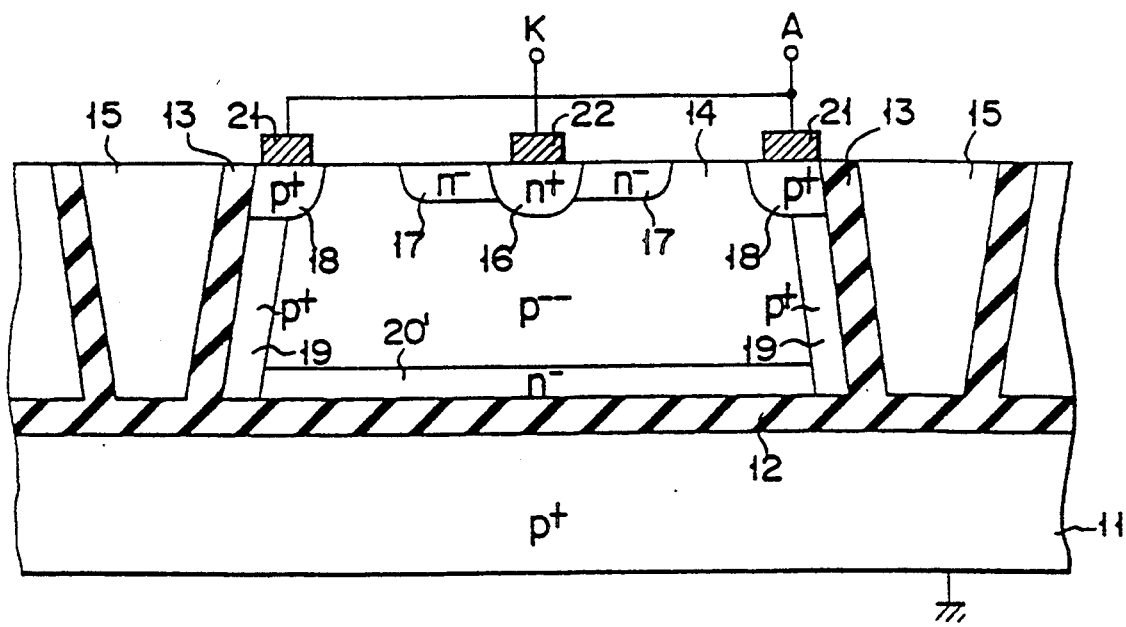
Figure 14:
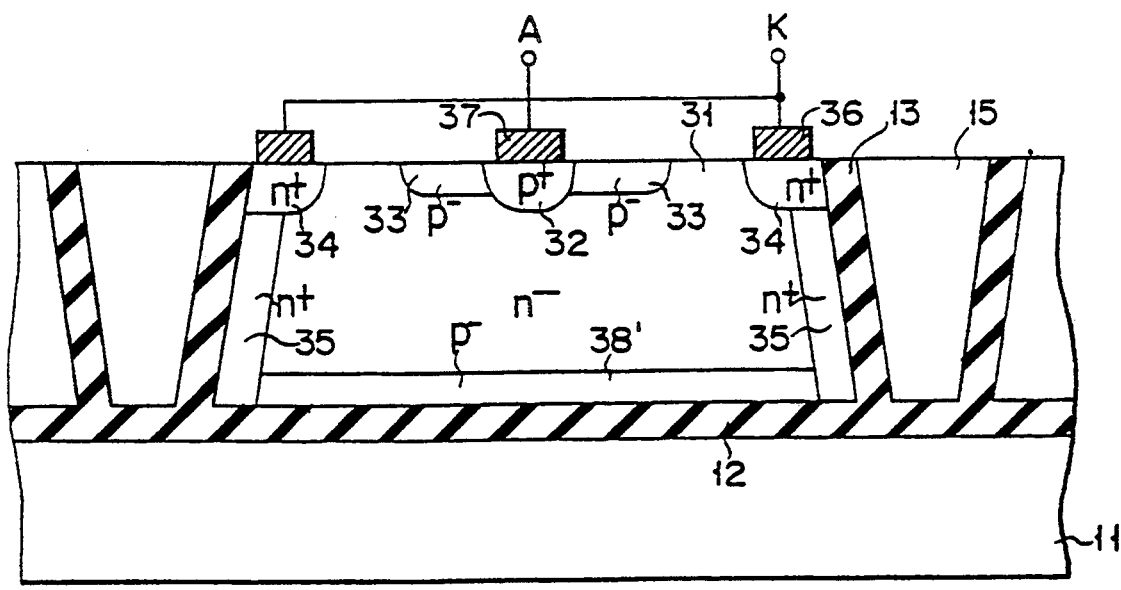
Figure 17:
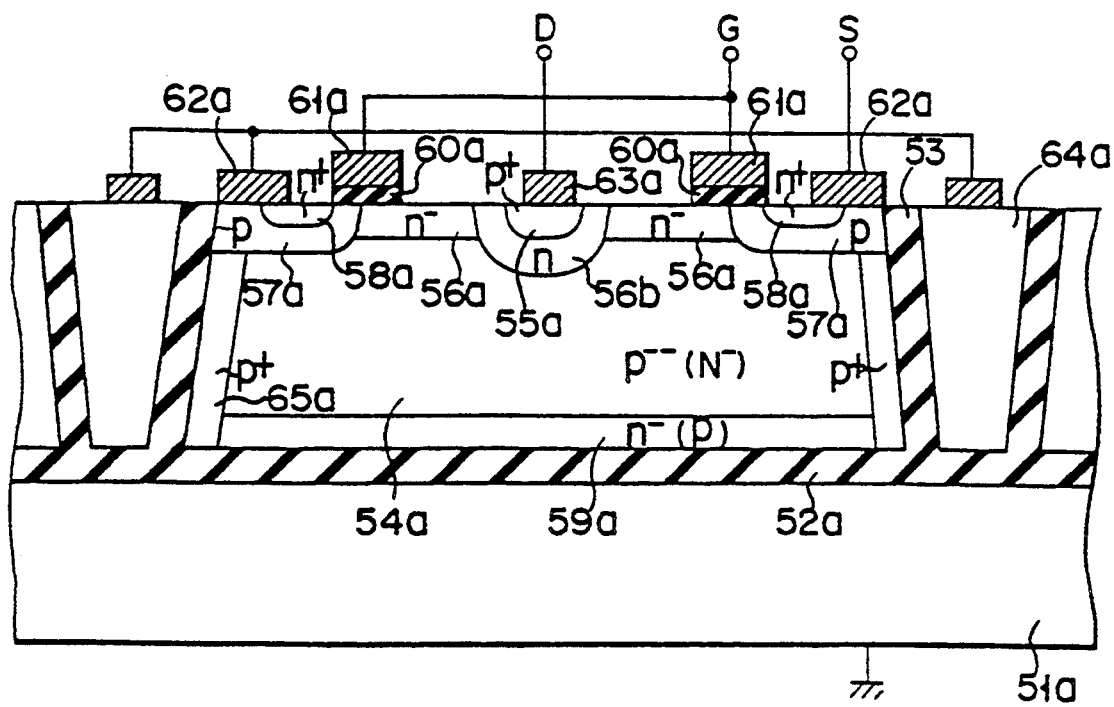
Figure 18:
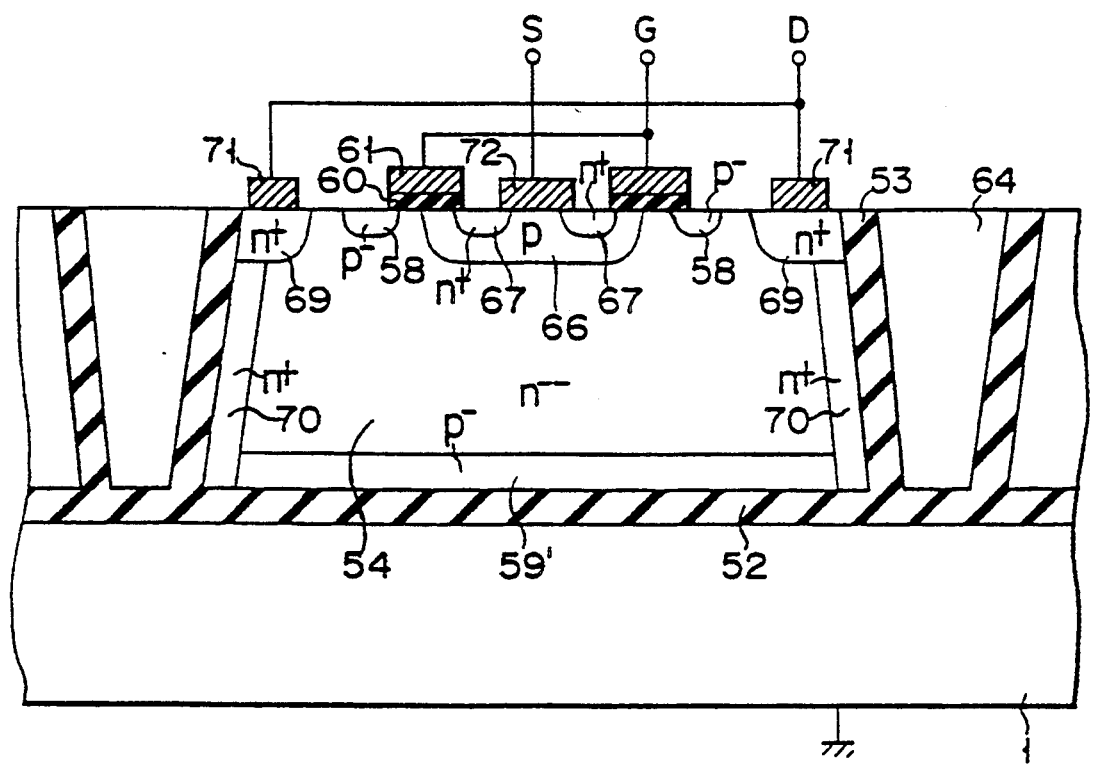
Figure 20:
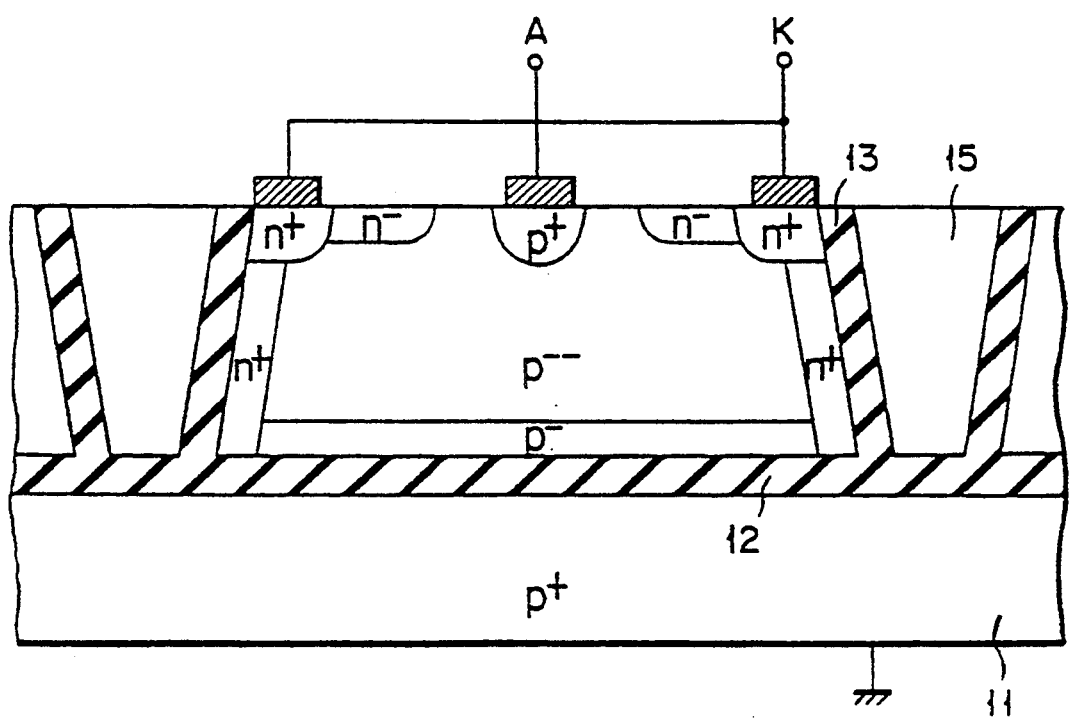
Figure 21:
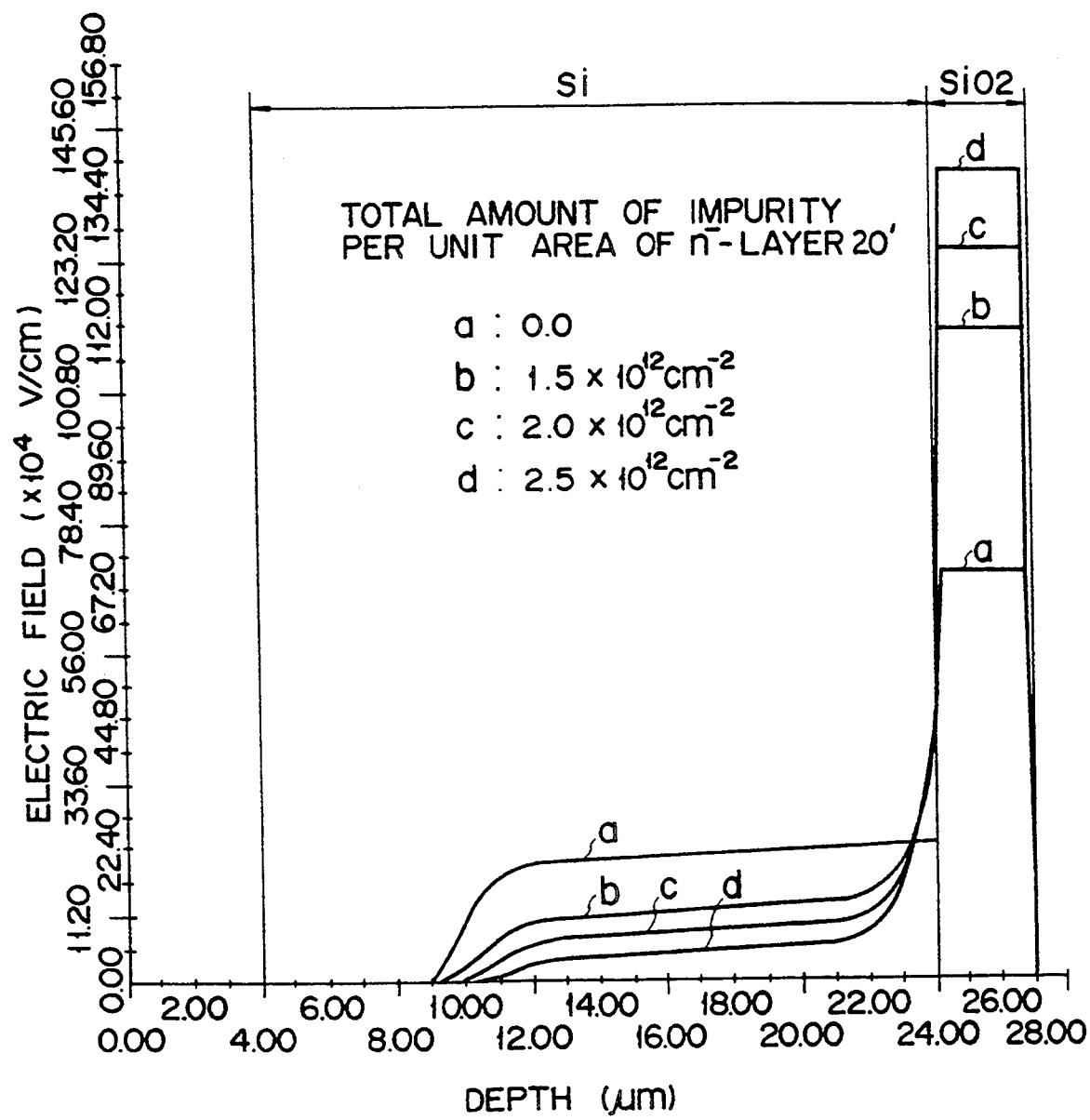
Figure 22:
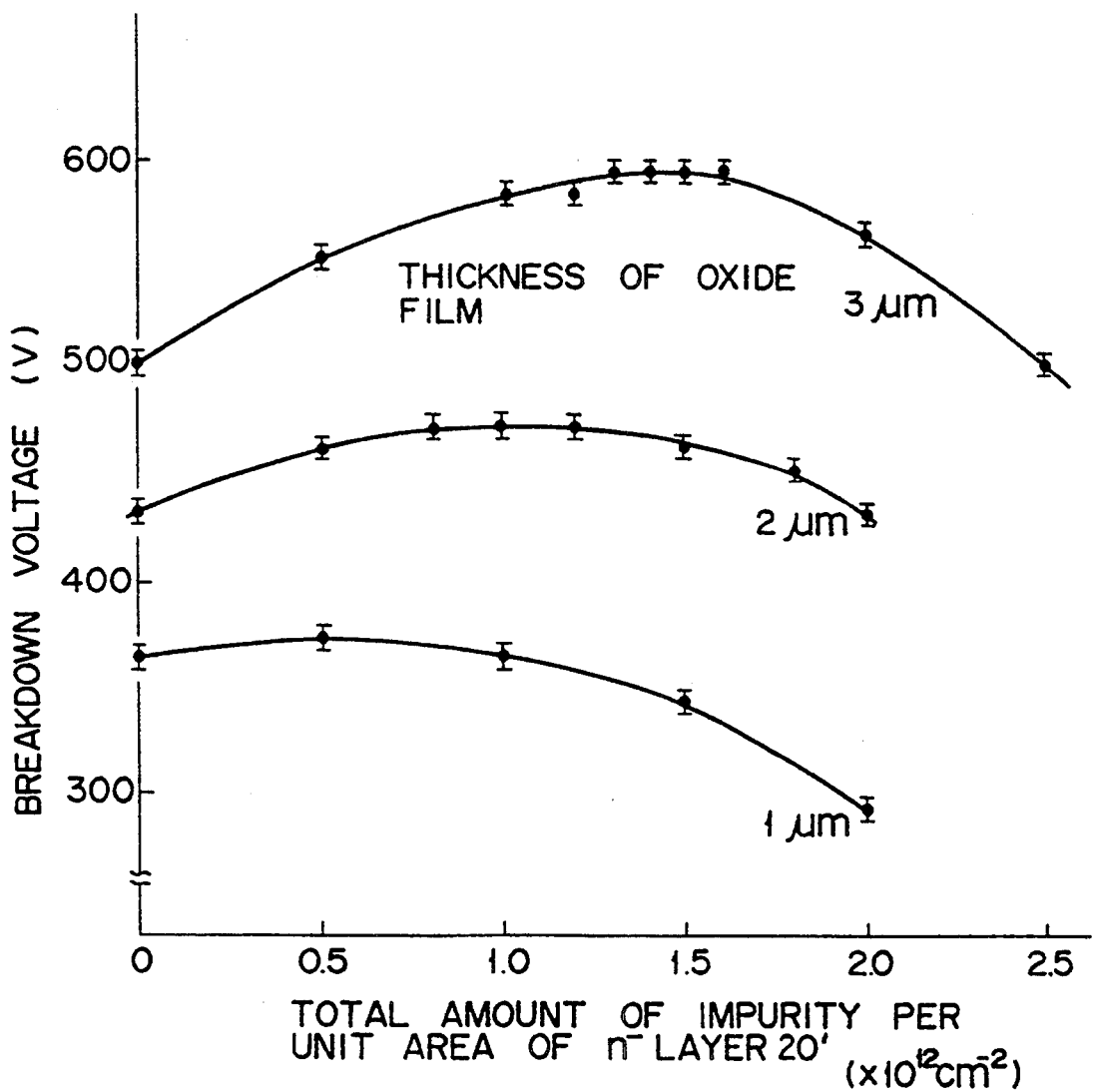
Figure 23:
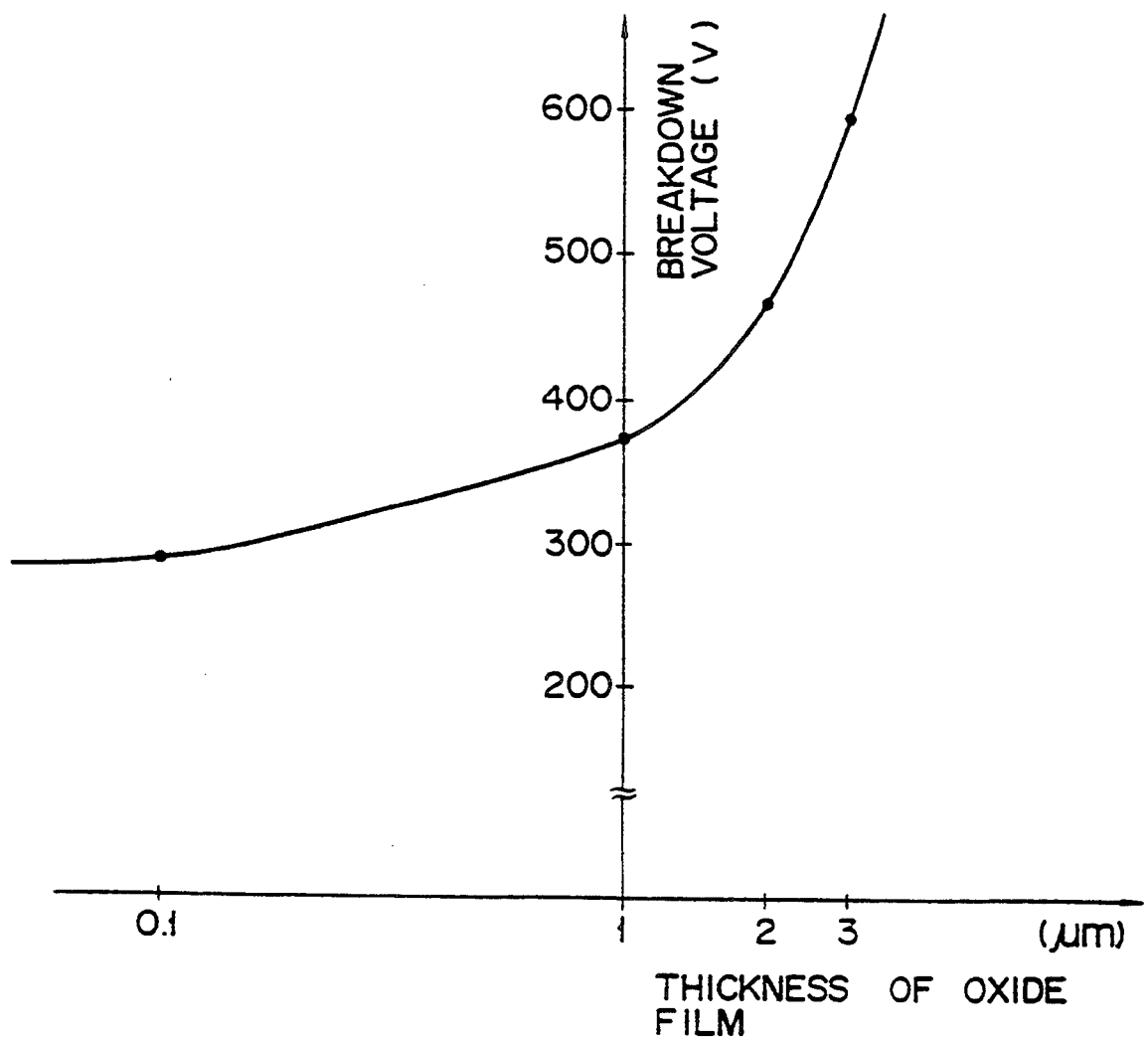
Figure 24:
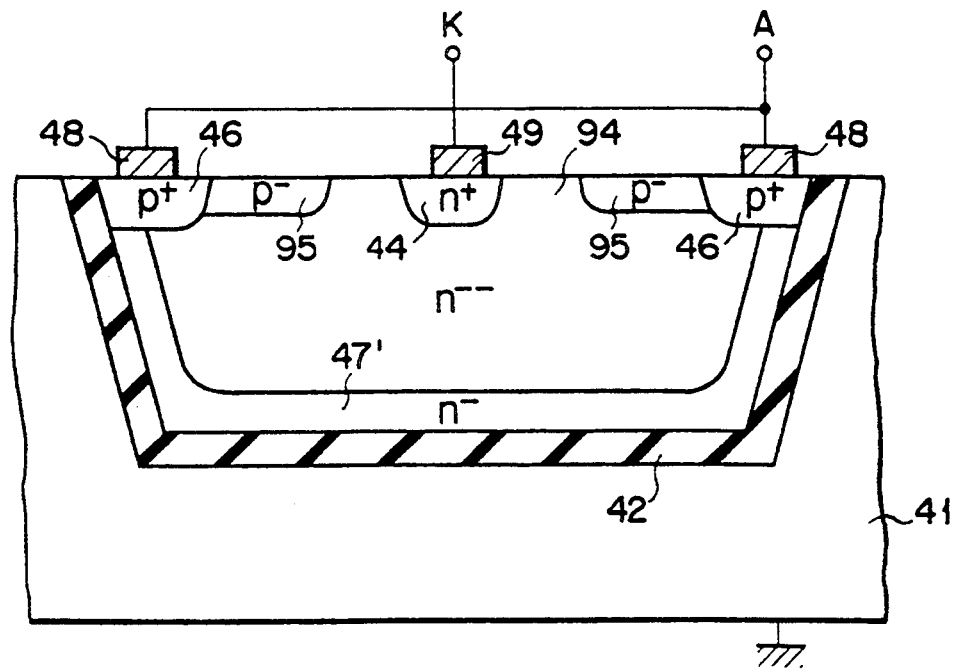
Figure 25:
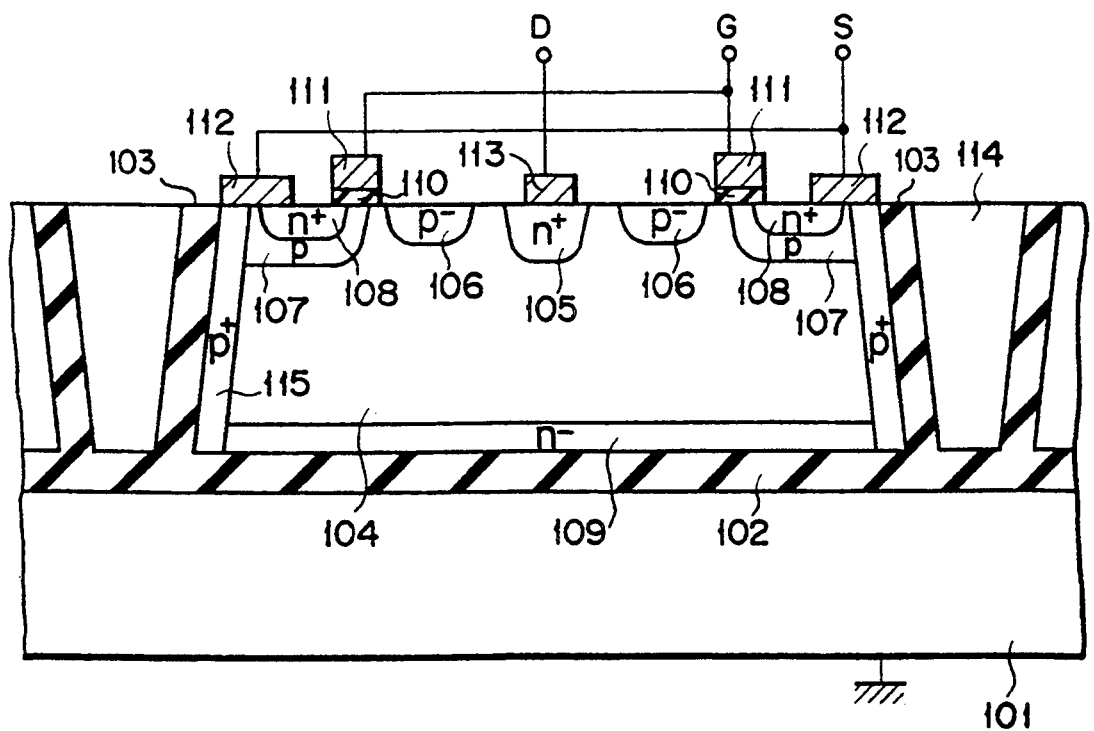
Figure 26:
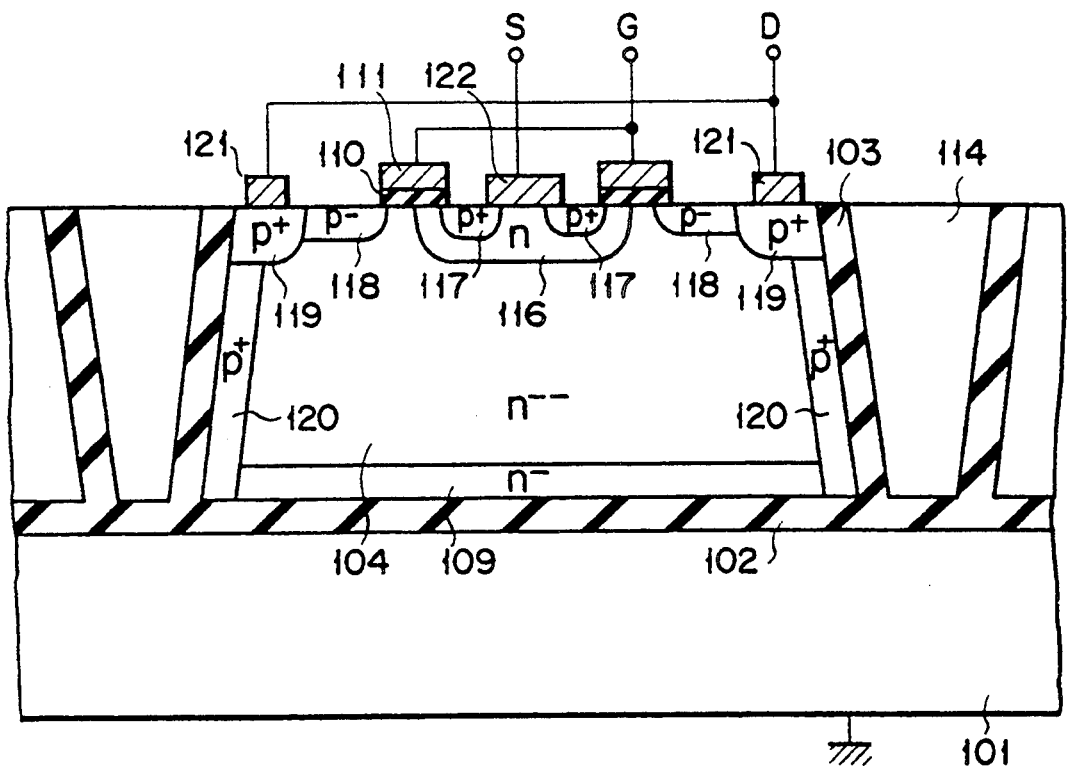
Figure 27:
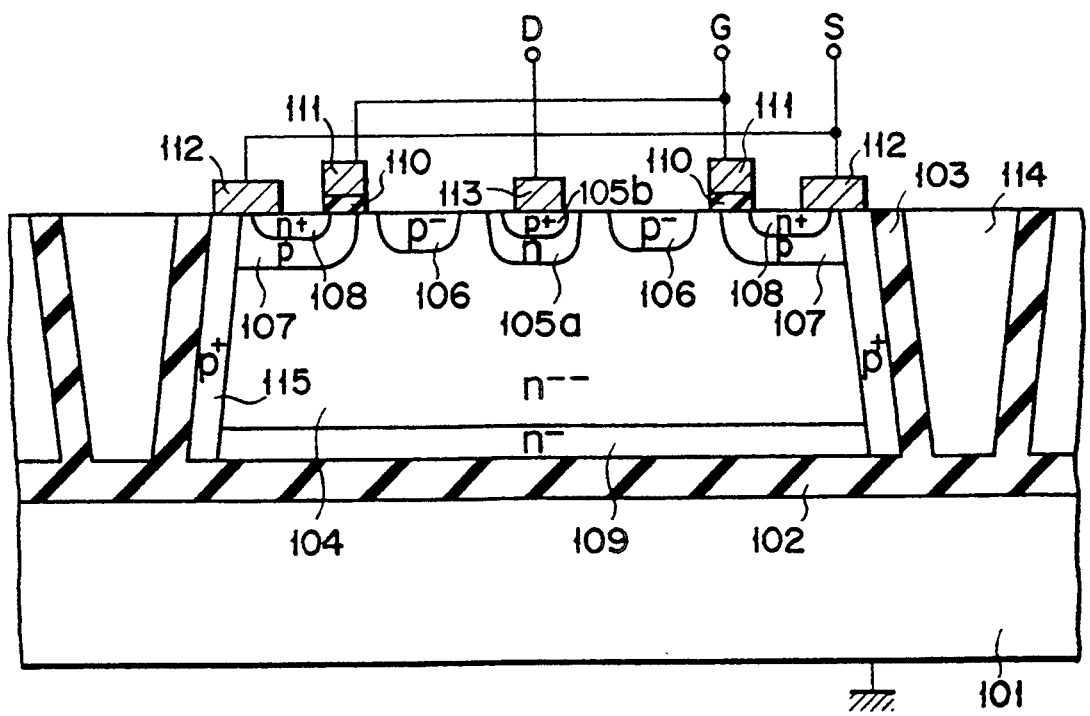
Figure 28:
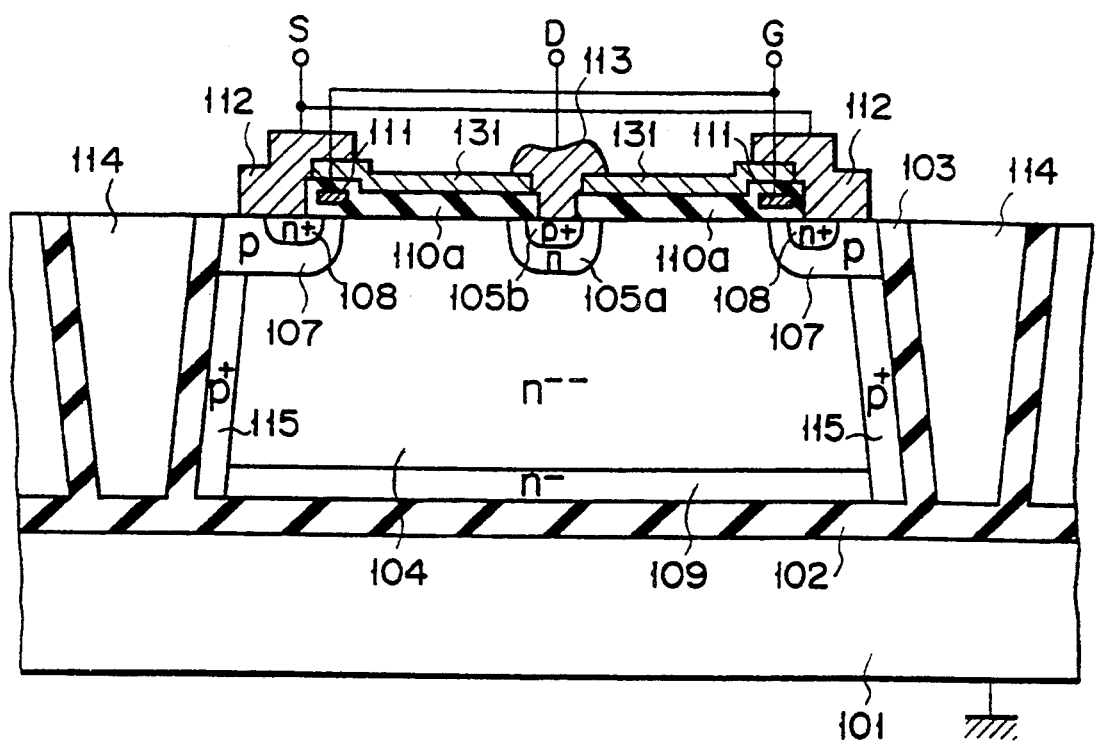
Figure 29:
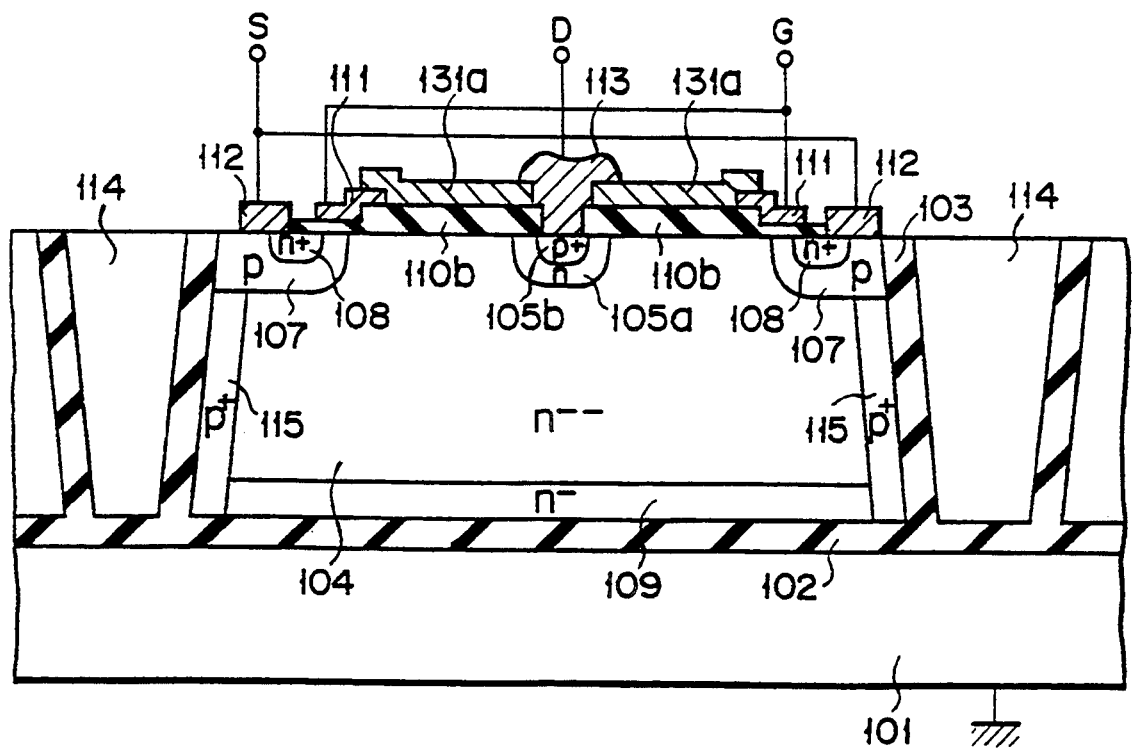
Figure 30:
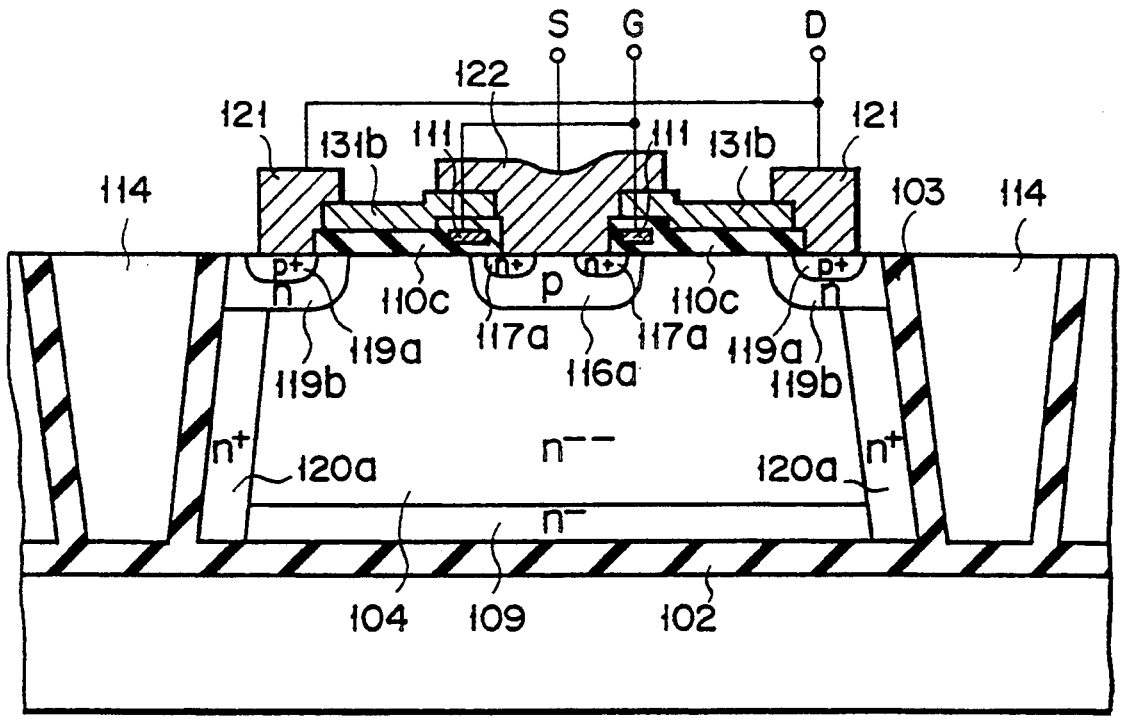
Figure 31:
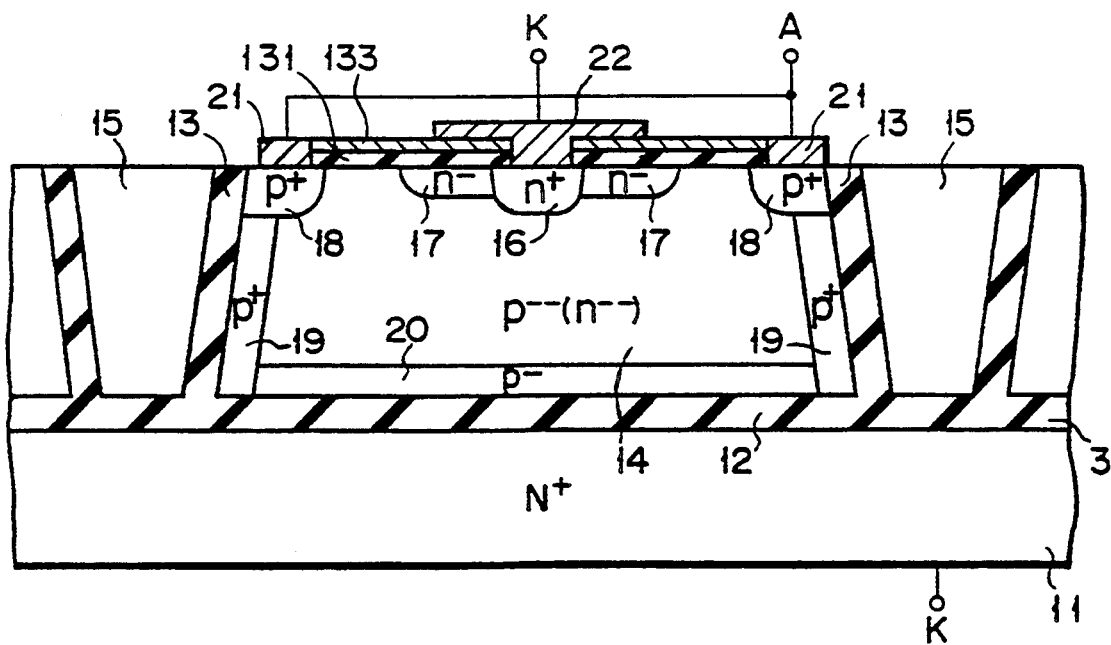
Figure 32:
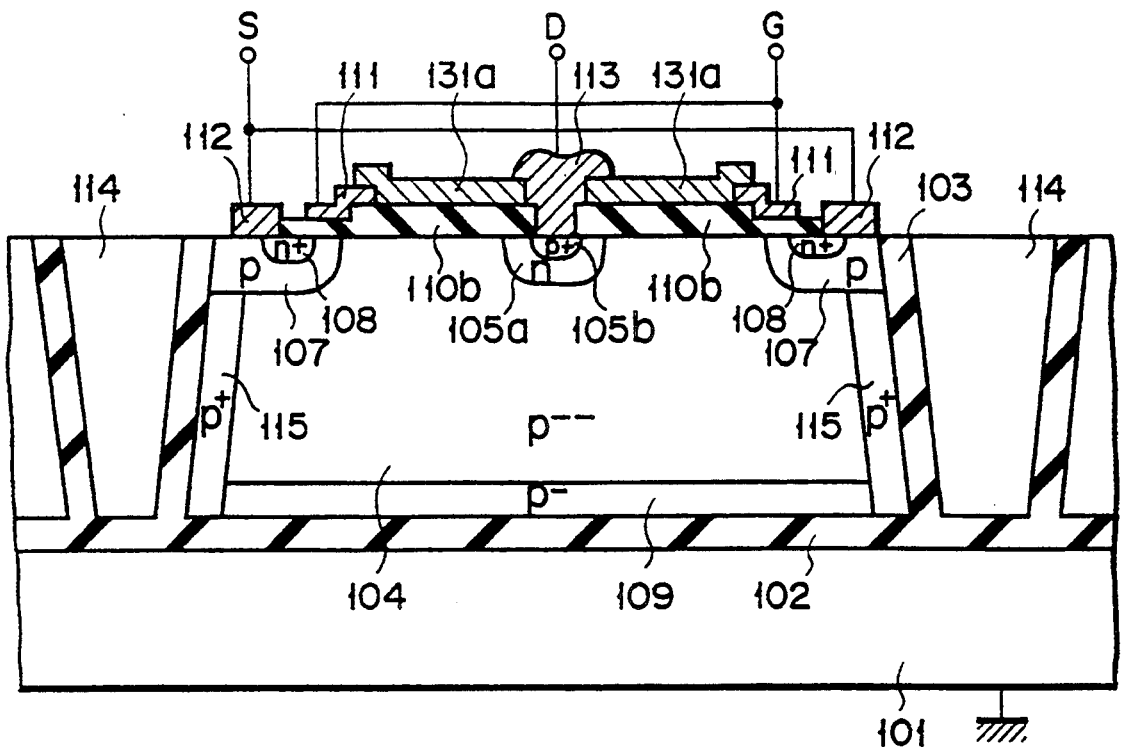
Figure 33:
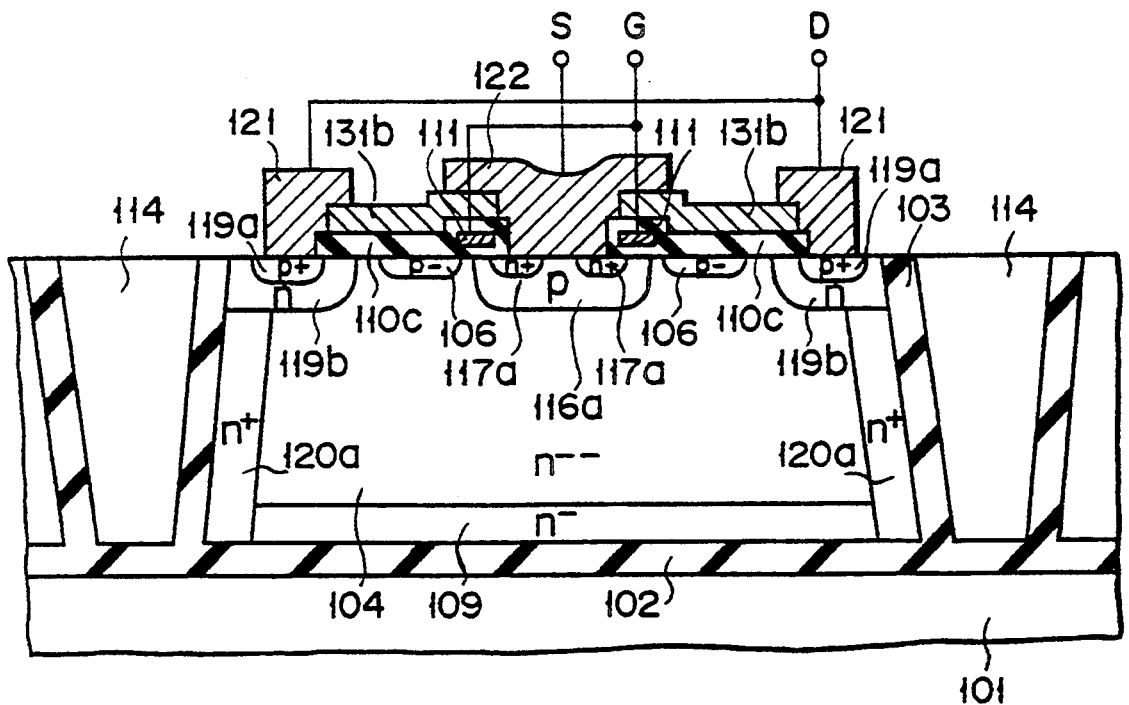

Fig, 7 is a sectional view of an n-channel MOS transistor according to still yet another embodiment of the present invention;

FIGS. 8 and 9 are sectional views of modifications of the diodes in FIGS. 3 and 4;

FIGS. 10 and 11 are sectional views of modifications of diodes obtained by performing p-n junction isolation as element isolation in a lateral direction;

FIG. 12 is a sectional view of a modification of a diode having a divided-anode structure;

FIG. 13 is a sectional view of a modification of the diode in FIG. 3;

FIG. 14 is a sectional view of a modification of the diode in FIG. 4;

FIG. 15 is a sectional view of a modification of the diode in FIG. 5;

FIG. 16 is a sectional view of a modification of the diode in FIG. 6;

FIG. 17 is a sectional view of a modification of a conductivity-moduration MOSFET obtained by changing the structure in FIG. 16;

FIG. 18 is a sectional view of an n-channel MOS transistor obtained by modifying the diode in FIG. 7;

FIG. 19 is a sectional view of a modification of the diode in FIG. 14;

FIG. 20 shows a modification of a diode of FIG. 19 by inverting a conductivity type of each portion of the diode;

FIGS. 21 to 23 are graphs showing characteristics of the diode in FIG. 19;

FIG. 24 is a sectional view of a modification of the diode in FIG. 15;

FIGS. 25 and 26 are sectional views of MOS transistors according to further another embodiments of the present invention;

FIG. 27 is a sectional view of a modification of the translator in FIG. 25;

FIG. 28 is a sectional view of a modification of the transistor in FIG. 27;

FIG. 29 is a sectional view of a modification of the transistor in FIG. 28;

FIG. 30 is a sectional view of a modification of the transistor in FIG. 29;

FIG. 31 is a sectional view of a modification of the diode in FIG. 3;

FIG. 32 is a sectional view of a modification of the transistor in FIG. 29;

FIG. 33 is a sectional view of a modification of the transistor in FIG. 30; and

Figure 36:
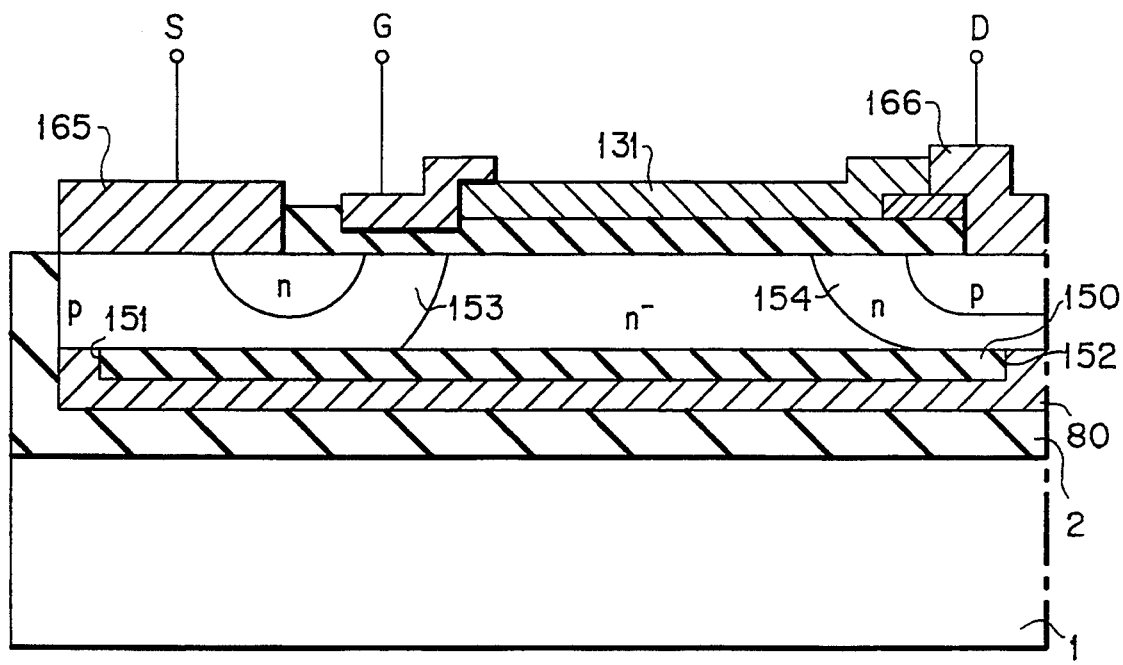
Figure 37:
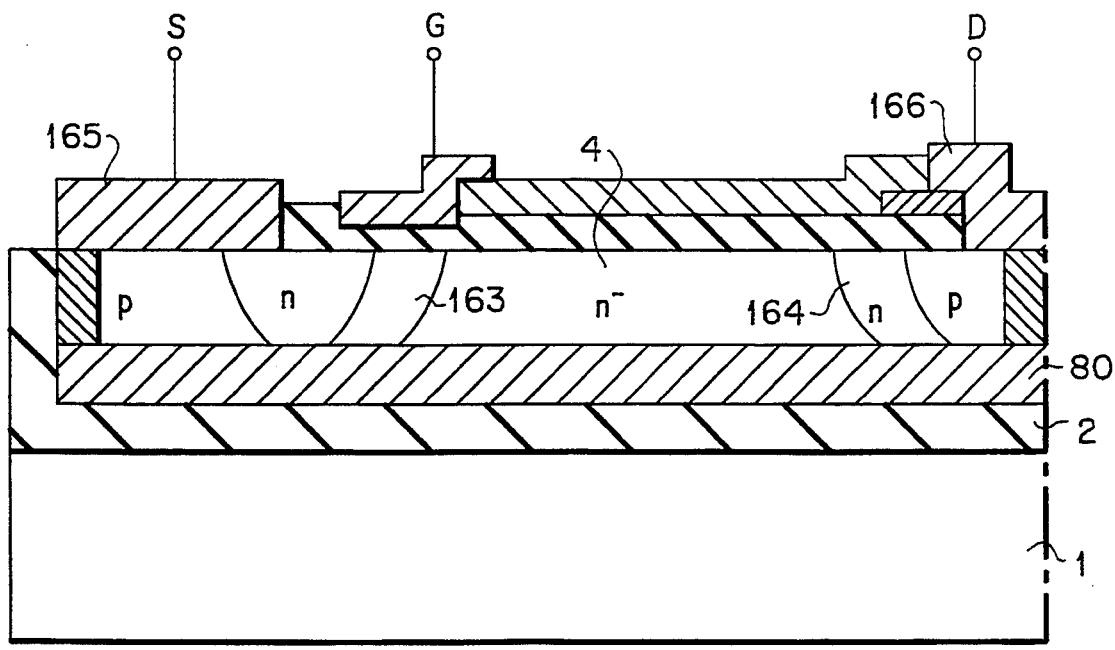

FIG. 34 is a sectional view of a still further embodiment of the present invention;

FIG. 35 is a sectional view of another embodiment of the present invention;

FIG. 36 is a section view of a modification of the transistor shown in FIG. 35; and FIG. 37 is a sectional view of another modification of the transistor shown in FIG. 35.

DETAILED DESCRIPTION OF THE PREFERRED EMBODIMENTS

Examples of the present invention will be described below with reference to the accompanying drawings.

FIG. 2 shows a high voltage diode according to an embodiment of the present invention.

Referring to FIG. 2, reference numeral 1 denotes an Si wafer obtained by bonding p+- and n⁻-Si substrates 1a and 1b by a direct bonding technique; 3, a bonding interface, and 2, oxide film formed on bonding interface 3. Part of p⁻-Si substrate 1b of Si wafer 1 is etched to a depth reaching bonding interface 3 to form a groove, thereby forming is land-like p⁻-layer 4. Oxide film 5 is formed on a side surface of the groove, and polycrystalline Si film 6 is buried therein. N+-layer 8 is formed in a central surface portion of p⁻-layer 4, which has been isolated from other regions by oxide films 2 and 5, and n⁻-layer 9 is formed around n+-layer 8, thereby constituting a diode. Furthermore, p+-layer 10 is formed in a peripheral surface portion of p⁻-layer 4 so as to form an anode electrode. Moreover, p+-layers 7a and 7b are formed along oxide films 2 and 5 so as to surround p⁻-layer 4.

In the diode described above, the potential of substrate 1a is shielded by p+-layer 7, thus facilitating the design of the diode. P+-layer 7b can shield the influence of crystal defects around the groove. The impurity concentration for the layer 7b should be greater than that for the layer 7a.

FIG. 3 shows a high voltage diode according to another embodiment of the present invention. Reference numeral 11 denotes an n+-Si substrate, on which island-like high-resistance Si layer 14 (first semiconductor region) is formed. Si layer 14 is isolated from substrate 11 by oxide film 12, and isolated from other element regions in a lateral direction by oxide film 13. High-resistance Si layer 14 is of a p⁻⁻- or an n⁻⁻-conductivity type having a sufficiently low impurity concentration (e.g., $1 \times 10^{14}/cm^3$). Polycrystalline Si film 15 is filled in an element isolation region. N+-layer 16 (second semiconductor region) having a high impurity concentration (impurity concentration: $1 \times 10^{19}/cm^3$) and serving as a cathode region is formed in a central surface portion of high-resistance Si layer 14. N⁻-layer 17 (third semiconductor region) (ion dose: $1 \times 10^{12}/cm^2$) serving as a guard ring for preventing edge breakdown is formed by impurity diffusion around n+-layer 16 and continuous therewith. P+-layers 18 and 19 (fourth semiconductor region) having a high impurity concentration (impurity concentration: $1 \times 10^{18}/cm^3$) are formed by impurity diffusion at a peripheral portion of p⁻-layer 14 to lead out an anode electrode. P⁻-layer 20 (fifth semiconductor region) having a low impurity concentration (ion dose: $1 \times 10^{12}/cm^2$) and a small film thickness (film thickness: about 3 µm) is formed on a bottom portion of high-resistance Si layer 14 and adjacent to oxide film 12. A total amount of impurity per unit area of each of p⁻- and n⁻-layers 20 and 17 is preferably set to be 0.1 to $3 \times 10^{12}/cm^2$. First and second electrodes 21 and 22 respectively formed on p+-and n+-layers 18 and 16.

In order to manufacture this diode, first n+-Si substrate 11 is bonded to a high-resistance Si substrate having high-resistance Si layer 14 by a direct bonding technique. More specifically, the two substrates are mirror-polished, and the mirror-polished surfaces are adhered to each other in a clean atmosphere and integrally bonded in a predetermined thermal process (e.g., temperature: 1,100° C.). In this case, p⁻-layer 20 and oxide film 12 are preformed before bonding on the surface of the high-resistance Si substrate, thereby obtaining high-resistance Si layer 14 electrically insulated from substrate 11 and having p⁻-layer 20 formed on its bottom portion. Then, an element isolation groove is formed by wet or dry etching techniques. P+-layer 19 is formed by impurity diffusion on the side surface of p⁻-layer 14 isolated in the form of an island in the previous process. An inner surface of the groove is oxidized to form oxide film 13. After polycrystalline Si layer 15 is filled in the groove, n+-, n⁻-, and p+-layers 16, 17, and 18 are formed by impurity diffusion. Finally, electrodes 21 and 22 are formed.

In above-mentioned process, where an oxide film is formed on the surface of substrate 11, the bonded wafer may be warped. It is preferable that an oxide film is formed only on high-resistance Si substrate.

In the diode arranged in this manner, when a reverse bias is applied between first and second electrodes 21 and 22, a depletion layer extends from n+-layer 16 formed in the central portion of the surface of the element into high-resistance Si layer 14 in a vertical direction. If the thickness of high-resistance Si layer 14 and the impurity concentration of p⁻-layer 20 are set at appropriate values, when Si layer 14 is completely depleted, its maximum electric field can be suppressed below a value at which avalanche breakdown occurs, and subsequently, p⁻-layer 20 on the bottom portion is depleted. When p⁻-layer 20 is depleted, the potential at electrode 21 is not supplied to a portion of p⁻-layer 20 directly under electrode 22. More specifically, a potential difference is generated in depleted p⁻-layer 20 in a lateral direction, and the voltage between electrodes 21 and 22 is divided into components in the vertical direction of high-resistance Si layer 14 and in the lateral direction of p⁻-layer 20. In other words, part of the voltage applied to the element is effectively divided by isolation oxide film 12. With this arrangement, this diode obtains a sufficient high-breakdown voltage characteristic even if Si layer 14 has a comparatively small thickness. In addition, by reducing the thickness of high-resistance Si layer 14, the dielectric isolation structure in FIG. 3 can be easily formed.

FIG. 4 shows a diode obtained by inverting a conductivity type of each impurity region of the element port ions in FIG. 3.

More specifically, p+-layer 32 is formed in a central surface portion of high-resistance Si layer 31 isolated by oxide films 12 and 13. P⁻-layer 33 is formed around p+-layer 32. N+-layers 34 and 35 are formed in a peripheral portion of high-resistance Si layer 31. First and second electrodes 36 and 37 are respectively formed on n+- and p+-layers 34 and 32 to constitute a diode. N⁻-layer 38 is formed on a bottom portion of high-resistance Si layer 31 contacting oxide film 12. The diode in FIG. 4 shows the same high-breakdown voltage characteristic as in the previous embodiment. In this case, when oxide film 12 is formed sufficiently thick, a high voltage can be easily imposed across the oxide film, thus obtaining a high breakdown voltage. The thickness of oxide 12 is preferably 1 μm or more, more preferably 2 μm or more.

FIG. 5 shows a diode having another dielectric isolation structure. In this structure, high-resistance n⁻⁻- or p⁻⁻-type Si layer 43 isolated by oxide film 42 is formed on a surface portion of polycrystalline Si layer 41. P+-layer 44 is formed in a central surface portion of Si layer 43, and p⁻-layer 45 is formed around p+-layer 44 to constitute a diode. N+-layer 46 is formed in a peripheral surface portion of n⁻-layer 43. First and second electrodes 49 and 48 are respectively formed on n+- and p+-layers 46 and 44. In addition, n⁻-layer 47 is formed on bottom and side portions of high-resistance Si layer 43 contacting oxide film 42.

In this structure, the high breakdown voltage can be obtained by forming n⁻-layer 47.

More specifically, in the diode having the above arrangement, when a reverse bias is applied between first and second electrodes 49 and 48, a depletion layer extends from p+-layer 44 formed in the central surface portion of the element into high-resistance Si layer 43 in the vertical direction. When the depletion layer reaches n⁻-layer 47, it extends through n⁻-layer 47 and reaches n+-layer 46.

FIG. 6 shows an embodiment wherein the present invention is applied to a MOS transistor. High-resistance n⁻⁻Si layer 54 (first semiconductor region) isolated by oxide films 52 and 53 is formed on Si substrate 51. Then, polycrystalline Si film 64 is filled through oxide film 53 in a groove formed in an isolation region. The element isolation structure of this transistor is the same as that in FIG. 3. P+-layer 55 (second semiconductor region) and p⁻-layer 56 serving as a drain region are formed in a central surface portion of high-resistance Si layer 54. N-layer 57 (fourth semiconductor region) serving as a channel region is formed around p⁻-layer 56. P+-layer 58 serving as a source region is formed in n-layer 57. First and second electrodes 62 and 63 as source and drain electrodes are respectively formed on p+- and n-layers 58 and 57 formed in a peripheral portion of Si layer 54, and on p+-layer 55 formed in the central portion thereof. Gate electrode 61 is formed on a surface portion of n-layer 57 between p+- and p⁻-layers 58 and 56 through gate insulating film 60. N⁻-layer 59 (fifth semiconductor region) is formed on a bottom portion of high-resistance Si layer 54 contacting oxide film 52.

In the MOS transistor of this embodiment, when a voltage lower than that of first electrode 62 serving as the source electrode is applied to second electrode 63 serving as the drain electrode, the voltage is divided by depletion layers, i.e., one extending from p+-layer 55 in the central portion of the element into high-resistance Si layer 54 and the other extending in n⁻-layer 59 in a lateral direction. As a result, in this embodiment, the high breakdown voltage can be also obtained.

FIG. 7 shows an embodiment wherein the present invention applied to an n-channel MOS transistor. In this embodiment, high-resistance n⁻⁻-Si layer 54 (first semiconductor region) has the same element isolation structure as that of the embodiment in FIG. 6. P-layer 66 (second semiconductor region) serving as a channel region is formed in a central portion of Si layer 54. N+-layer 67 serving as a source region is formed in p-layer 66. Gate electrode 61 is formed between n+-layer 67 in p-layer 66 and Si layer 54 through gate insulating film 60. P⁻-layer 68 (third semiconductor region) is formed in the surface of Si layer 54 under gate electrode 61 so as to be slightly separated from p-layer 66. N+-layers 69 and 70 (fourth semiconductor region) serving as a drain region are formed in a peripheral surface portion of Si layer 54. First and second electrodes 71 and 72 serving as drain and source electrodes are formed on n+-layer 67, and p- and n+-layers 66 and 67, respectively. Similar to the previous embodiment, n⁻-layer 59 (fifth semiconductor region) is formed in a region where a portion of high-resistance Si layer 54 contacts oxide film 52.

This MOS transistor is operated by applying a positive drain voltage to first electrode 71 with respect to second electrode 72. In an OFF state where the gate voltage is zero or negative and a channel is not formed in p-layer 66, a depletion layer extending from p-layer 66 can easily reach p⁻-layer 68. Although p⁻-layer 68 is not in directly contact with p-layer 66, it serves as a guard ring in the same manner as described in each embodiment. The voltage between the drain and source is divided in the vertical and lateral directions by depleted Si layers 54 and 68, and n⁻-layer 59. Therefore, a high-breakdown voltage characteristic can be obtained.

FIG. 8 shows a modification of the embodiment in FIG. 3. High-resistance film 80 having a resistance of, e.g., $10^8$ Ω or more, such as a semi-insulating polycrystalline Si film (SIPOS) is arranged at an interface between p⁻-layer 20 and oxide film 12 in the structure of FIG. 3.

Similarly, FIG. 9 shows a structure wherein high-resistance film 80 is arranged at an interface between n⁻-layer 38 and oxide film 12 in the structure of FIG. 4.

By forming high-resistance film 80 in this manner, influences of the potential at substrate 11 can be reduced. That is, a small current flows through the high-resistance film from the high potential side to the low potential side to form a potential gradient, thereby shielding an external electric field. In addition, since oxide film 12, substrate 11, and high-resistance film 80 constitute a capacitor, part of the applied high voltage can be directed to oxide film 12.

FIG. 10 shows a modification of the embodiment in FIG. 4, wherein element isolation in the lateral direction is performed by a p-n junction isolation structure. When high-resistance Si layer 31 is a p⁻⁻⁻-layer, as shown in FIG. 10, element isolation in the lateral direction is performed by forming n+-layer 35 reaching oxide film 12.

FIG. 11 shows a p-n junction isolation structure in the lateral direction, wherein high-resistance Si layer 31 is an n⁻⁻⁻-layer. As shown in FIG. 11, p+-layer 101 for isolation is required between elements. P⁻-layer 102 is formed around p+-layer 101 to prevent a high electric field from being applied. In FIG. 11, n+-layer 35 reaching oxide film 12 is not necessarily required. A p-n junction structure can be applied to element isolation in the lateral direction in the embodiment in FIG. 3 and other embodiments and modifications. In such a case, the present invention is also effective.

FIG. 12 shows a modification based on the structure in FIG. 4, wherein the anode portion is divided into a plurality of portions. This structure is effective to uniformly distribute an anode current when the element area is large. In this structure, the high breakdown voltage can be obtained by forming n⁻-layer 38 in the same manner as in FIG. 4.

In the all embodiments and modifications described above, the third and fifth semiconductor layers are of the opposite conductivity types. As opposed to these, the fifth semiconductor layer can be of the same conductivity type as that of the third semiconductor layer. Such modifications will be described below.

FIG. 13 shows a modification wherein high-resistance Si layer 14 is of a p$^{---}$-type and a low-concentration layer to be formed on a bottom portion thereof is n$^-$-layer 20' in the structure of FIG. 3. Similarly, in this structure, a total amount of impurity of n$^-$-layer 20' is set to be 0.1 to 3×10$^{12}$/cm$^2$.

In this modification, the breakdown voltage can be increased. In this element structure, the reason why the breakdown voltage is increased can be explained as follows. In this structure, p$^+$-layers 18 and 19, n$^-$-layer 20', high-resistance p$^{---}$-Si layer 14, and n$^+$-layer 16, i.e., a p-n-p-n structure is formed between the anode and cathode. When a reverse bias is applied to the element, a depletion layer vertically extends from n$^+$-layer 16 formed in a central portion of the element into high-resistance Si layer 14 and another depletion layer simultaneously extends from p$^+$-layer 18 in a peripheral surface portion of Si layer 14 into n$^-$-layer 20' in the lateral direction. As a result, the voltage between the anode and cathode is divided by the depletion layers respectively extending into Si layer 14 and n$^-$-layer 20', thereby preventing a high electric field from being applied to only Si layer 14.

FIG. 14 shows a modification wherein Si layer 31 is of n$^{---}$-type and a low-concentration layer to be formed on its bottom portion is p$^-$-layer 38' in the structure of FIG. 4.

FIG. 15 shows a modification of the structure of FIG. 5 wherein all conductivity types have been reversed and the p$^-$-layer 47 is replaced with n$^-$-layer 47'.

FIG. 16 shows a modification wherein of the structure of FIG. 6 wherein all conductivity types have been reversed and the p$^-$-layer 59 is replaced with n$^-$-layer 59'.

FIG. 17 shows a modification wherein the structure in FIG. 16 is slightly modified and a p-n-p-n structure is formed between the drain and source to constitute a conductivity-modulation MOS FET. P$^{---}$-layer 54a and n$^-$-layer 59a can be replaced by N$^-$-layer and P-layer, respectively. In this structure, the impurity concentration for the n$^-$-layer 56a can be larger than that for n-layer 56b. However, impurity dose (cm−2) for n$^-$-layer 56a still should be lower than that for n-layer 56b. Furthermore, the impurity concentration for n$^-$-layer 59a can be larger than that for n-layer 56b.

FIG. 18 shows a modification wherein n$^-$-layer 59 is replaced with p$^-$-layer 59' in the structure of FIG. 7.

FIG. 19 shows a modification wherein p$^{---}$-layer 14 and n$^-$-layer 17 are replaced with n$^{-31}$-layer 84 and p$^-$-layer 87 in the structure of FIG. 13. P$^-$-layer 87 is separated from n$^+$-layer 86 and is adjacent to p$^+$-layer 88.

FIG. 20 shows a modification of a diode of FIG. 19 by inverting a conductivity type of each portion of the diode.

FIG. 21 shows a result of calculating a vertical component of an electric field as a function of a depth from the device surface of the high voltage diode shown in FIG. 19. Note that in a graph shown in FIG. 21, data is obtained when the thickness of n$^{-31}$-layer 84 is 20 μm, the depth of n$^+$-layer 86 is 8.7 μm, and the thickness of silicon oxide film 12 is 3 μm, and a total amount of impurity per unit area of n$^-$-layer 20' is used as a parameter. An impressed voltage is 500 V. An area of a region below electric field distribution curves shown in FIG. 21 represents a voltage.

Similarly, FIG. 22 shows a result of obtaining a relationship between a voltage at which breakdown occurs in a region immediately above silicon oxide film 12 and a total amount of impurity per unit area of n$^-$-layer 20' of the high voltage diode shown in FIG. 19 by using the thickness of film 12 as a parameter. As described above, data is obtained when the thickness of n$^{-31}$-layer 84 is 20 μm and the depth of n$^+$-layer 86 is 8.7 μm.

FIG. 23 shows a relationship between silicon oxide film 12 and a breakdown voltage of the high voltage diode shown in FIG. 19.

As is apparent from the data in FIGS. 21 to 23, assuming that the thickness of n$^{---}$-layer 84 is 20 μm, a breakdown voltage of 450 V can be obtained when the thickness of film 12 is 2 μm or more and a total amount of an impurity per unit area of n$^-$-layer 20' is 0.5×10$^{12}$ to 2.0×10$^{12}$ cm$^{-2}$.

Similarly, in these modifications of FIGS. 14 to 20, the breakdown voltage characteristics can be improved.

FIG. 24 shows a modification of a diode wherein n$^{---}$-layer 94 and p$^-$-layer 95 are formed in place of p$^{---}$-layer 43 and n$^-$-layer 45 in the structure of FIG. 15, respectively, to be separated from n$^+$-layer 44 and adjacent to p$^+$-layer 46. Also in this modification, a high breakdown voltage can be obtained because n$^-$-layer 47' is present.

FIG. 25 shows an embodiment in which the present invention is applied to a MOS transistor. Island-like n$^{---}$-high resistance silicon layer 104 (first semiconductor layer) isolated by oxide films 102 and 103 is formed on Si substrate 101, and polycrystalline silicon layer 114 is buried in a groove formed in an isolation region through oxide film 103. This element isolation structure is the same as that shown in FIG. 19. N$^+$-layer 105 (second semiconductor layer) serving as a drain region is formed in a central surface portion of high-resistance layer 104, p-layer 107 (fourth semiconductor layers) serving as a channel region is formed around n$^+$-layer 105, and n$^+$-layer 108 serving as a source region is formed in p-layer 107. P$^+$-layer 115 is formed around high-resistance silicon layer 104. P$^-$-layer 106 (third semiconductor layer) is formed between n$^+$-layer 105 and p-layer 107. First electrode 112 serving as a source electrode is formed on n$^+$-layer 108 and p-layer 107 at a peripheral portion, and second electrode 113 serving as a drain electrode is formed on n$^+$-layer 115 at a central portion. Gate electrode 111 is formed on a surface portion of p-layer 107 between n$^+$-layer 108 and high-resistance silicon layer 104 through gate insulating film 110. N$^-$-layer 109 (fifth semiconductor layer) is formed on a bottom portion of high-resistance silicon layer 104 which is in contact with oxide film 102.

The MOS transistor of this embodiment is operated by applying a voltage which is positive with respect to first electrode 112 as a source electrode to second electrode 113 as a drain electrode. In an off state wherein a gate voltage is zero or positive and no channel is formed in p-layer 107, a depletion layer extending from p-layer 107 easily reaches p$^-$-layer 106. Although p$^-$-layer 106 is not directly in contact with p-layer 107, it serves as a guard ring similar to p$^-$-layer 95 of the diode shown in FIG. 24. Since the voltage between the drain and source is divided into components in the vertical and lateral directions by depleted silicon layers 104 and 106 and n$^-$-layer 109, a high-breakdown voltage characteristic can be obtained.

FIG. 26 shows an embodiment in which the present invention is applied to a p-channel MOS transistor. In this embodiment, n$^{--}$-high resistance silicon layer 104 (first semiconductor layer) having an element isolation structure similar to the embodiment shown in FIG. 25 is used. N-layer 116 (second semiconductor layer) serving as a channel region is formed in a central portion of silicon layer 104, and p$^+$-layer 117 serving as a source region is formed in p-layer 116. P$^+$-layers 119 and 120 (fourth semiconductor layer) serving as drain regions are formed at a peripheral portion of silicon layer 104. Gate electrode 111 is formed on a surface portion of high-resistance silicon layer 104 between p$^+$-layers 118 and 119 through gate insulating film 110. First electrode 121 serving as a drain electrode is formed on p$^+$-layer 119, and second electrode 122 serving as a source electrode is formed on n-layer 116 and p$^+$-layer 117. N$^-$-layer 109 (fifth semiconductor layer) is formed on a region of a bottom portion of high-resistance silicon layer 104 which is in contact with oxide film 102 as in the previous embodiment.

In this MOS transistor, when a voltage higher than that applied to first electrode 121 serving as a drain electrode is applied to second electrode 122 serving as source electrode, the voltage is divided into components in the vertical and lateral directions by a depletion layer extending from p$^+$-layers 119 and 120 into the silicon layer and completely depleted n$^-$-layer 109. Therefore, a high-breakdown voltage characteristic can be obtained.

FIG. 27 shows a conductivity modulation type MOSFET wherein the structure of FIG. 25 is slightly modified and a p-n-p-n structure is formed between the drain and source. That is, a region constituted by n-layer 105a and p$^+$-layer 105b formed therein is formed in place of n$^+$-layer 105 serving as a drain region of the MOS transistor shown in FIG. 25. Note that n-layer 105a need not be formed. Also in this conductivity modulation type MOSFET, a high breakdown voltage can be obtained.

FIG. 28 shows a modification wherein the structure of FIG. 27 is slightly modified and high-resistance film 131 consisting of a polycrystalline material is formed between source electrode 112 and drain electrode 113 in place of p$^-$-layer 106 (fourth semiconductor layer) serving as a guard ring. When a reverse bias is applied between source and drain electrodes 112 and 113, a small current flows through high-resistance film 131, and a uniform potential gradient is formed between electrodes 112 and 113. For this reason, film 131 prevents edge breakdown as in p$^-$-layer 106 of the FET shown in FIG. 27.

FIG. 29 shows a modification of the structure of FIG. 28 wherein high-resistance film 131a is formed between gate electrode 111 and drain electrode 113. The same effect as that of the FET of FIG. 28 can be obtained by this FET.

Note that in the FETs shown in FIGS. 27 to 29, if n-type layer 105a is omitted, a sufficient high breakdown voltage can be obtained.

FIG. 30 shows a conductivity modulation type MOSFET wherein the structure of FIG. 26 is modified. In this FET, n$^+$-layer 117a serving as a source region is formed in p-layer 116a (second semiconductor layer) formed in a central portion of silicon layer 104 (first semi-conductor layer), and p$^+$-layer 119a serving as a drain region is formed in n-layer 119b (third semiconductor layer) formed in a peripheral portion of silicon layer 104. High-resistance film 131b is formed between source electrode 122 formed on n$^+$-layer 117a and drain electrode 121 formed on p$^+$-layer 119a. Also in this FET, high-resistance film 131b functions to effectively prevent edge breakdown. The impurity concentration for n$^-$-layer 109 can be larger than that for n-layer 119b.

FIG. 31 shows a modification wherein high-resistance film 133 is formed between anode electrode 21 and cathode electrode 22 in the diode of FIG. 3, thereby obtaining a higher breakdown voltage.

FIG. 32 shows a modification of the FET of FIG. 29 wherein the conductivity types of silicon layer 104 and n$^-$-layer 109 are reversed.

FIG. 33 shows a modification of the FET of FIG. 30 wherein p$^-$-layer 106 is formed as a guard ring in a peripheral portion of p-layer 116a.

As has been described, according to the present invention, a semiconductor element having a dielectric isolation structure comprises a second semiconductor layer of a first conductivity type in a surface portion of a first semiconductor layer having a sufficiently low concentration of impurity and isolated by an insulating film, a low-concentration third semiconductor layer of the first conductivity type formed around the second semiconductor layer, and a high-concentration fourth semiconductor layer of a second conductivity type formed around the first semiconductor layer. In this semiconductor element, since a fifth semiconductor layer having a low impurity concentration is formed on a bottom portion of the first semiconductor layer contacting an insulating film, part of a reverse-biased voltage applied to the element can be directed to the isolation insulating film by the third semiconductor layer. As a result, a sufficiently high breakdown voltage can be obtained even if the first semiconductor layer is thin. In addition, since the first semiconductor layer is allowed to have a small thickness, a dielectric isolation structure can be easily formed.

FIG. 34 shows still another embodiment of the present invention. As seen from the drawing, a high resistivity film 80, e.g., SIPOS, is deposited on a high resistivity substrate 4, followed by forming an oxide film 2 by means of, for example, CVD. Then, the oxide film 2 is bonded directly to another substrate 1 formed of a single crystalline or polycrystalline silicon. Instead of the bonding, it is possible to deposit a thick polycrystalline silicon layer on the oxide film 2.

In the next step, a rubbing treatment is applied to the substrate 4 for controlling the thickness thereof, followed by forming in the substrate 4 a trench reaching the high resistivity film 62. The trench is oxidized to form an oxide film 3 and, then, filled with a polycrystalline silicon 5. Further, the substrate surface is flattened followed by forming diffusion layers 6 and 7.

Suppose the SIPOS 80 is not included in the device of the construction described above. In this case, a depletion layer extends from the oxide film 2 into the n-type substrate, if a high potential is applied to the cathode 8 with the substrate connected to ground. However, the electric field of the substrate is shielded by the SIPOS 80, with the result that the substrate is not affected by the potential applied to the cathode 8, improving the breakdown voltage between the electrodes 8 and 9. It should be noted in this connection that, if an electric field is applied to the SIPOS 80, electric charges are induced on the surface by a deep level of band gap, with the result that the lines of electric force are stopped there. Further, a microcurrent flows through the SIPOS. Since the current flowing through the SIPOS determines the potential gradient, the SIPOS serves to shield the potential applied from the outside.

FIGS. 35 and 36 illustrate the situation where a high resistivity film 80 as in FIG. 34 is applied to an IGBT. The dielectric body-separated substrate in the embodiment of FIG. 35 is prepared substantially as in FIG. 34, except that the rubbing treatment is applied to the high resistivity substrate 4 such that the thickness of the substrate 4 is controlled to fall within a range of between 1 and 5 microns. Since the substrate 4 is thin, a p-type diffusion region 153 and an n-type diffusion region 154 extend to reach the high resistivity film 80 so as to achieve an electrical connection. It should be noted that both ends of the high resistivity film 80 are equal in potential level to the source electrode 165 and the drain electrode 166 so as to form a uniform potential gradient therebetween. Also, the effect of potential given to the substrate is shielded, as in the embodiment of FIG. 34, making it possible to obtain a high breakdown voltage.

The IGBT shown in FIG. 36 is substantially equivalent to the device shown in FIG. 34, except that an oxide film 150 is further formed between the high resistivity film 80 and the high resistivity substrate 4. For preparing the IGBT shown in FIG. 36 the oxide film 150 is formed on the surface of the substrate 4, followed by forming contact holes 151 and 152 in the oxide film 150 and subsequently forming the high resistivity film 80 such as SIPOS film by means of deposition. On the other hand, an oxide film is formed by CVD or thermal oxidation on the surface of the high resistivity film 80 and on at least one surface of another substrate 1 so as to achieve a direct bonding between the high resistivity film 80 and the substrate 1. It is possible to deposit a thick polycrystalline silicon film on the substrate 1 in place of forming an oxide film for the bonding with the high resistivity film 80.

In the next step, a trench is formed for the element isolation as in the embodiment shown in FIG. 34. It should be noted that the high resistivity substrate 4 has a thickness of 1 to 4 microns as in the embodiment shown in FIG. 35, with the result that diffusion regions 153, 154 extend to reach the high resistivity film 80. Both end regions of the high resistivity film 80 are electrically connected to the source electrode 165 and the drain electrode 166 through these diffusion regions 153 and 154, respectively. Since the high resistivity film 80 is insulated from the high resistivity silicon substrate 4 by the oxide film 150 interposed therebetween, the potential gradient formed in the high resistivity film 80 is rendered more uniform than in the embodiment shown in FIG. 35. It is possible to further improve the breakdown voltage, if contact holes are formed below the source electrode 165 and the drain electrode 166 so as to connect these sources and drain electrodes via a metal layer filling said contact holes.

What is claimed is:

1. A high breakdown voltage semiconductor device, comprising:
    a composite substrate obtained by directly bonding a high-resistance semiconductor substrate having an insulating film formed on at least one surface thereof to a semiconductor substrate, said insulating film being formed at an interface thereof;
    a first semiconductor region constituting part of said high-resistance semiconductor substrate and isolated from other regions by an isolating region;
    a second semiconductor region of a first conductivity type having an impurity concentration higher than that of said first semiconductor region and selectively formed in a surface portion of said first semiconductor region;
    a fourth semiconductor region of a second conductivity type having an impurity concentration higher than that of said first semiconductor region and formed in the surface portion of said first semiconductor region so as to be outside said second semiconductor region;
    a fifth semiconductor region formed on a bottom portion of said first semiconductor region, and having a dose of impurity atoms not more than $5 \times 10^{14}/cm^2$; and
    a sixth semiconductor region of a second conductivity type having an impurity concentration higher than that of said fifth semiconductor region and formed so as to extend from said fourth semiconductor region to said fifth semiconductor region, depletion layers being formed in said first, third and fifth semiconductor regions when a high voltage is applied between said second and fourth semiconductor region, and the applied voltage being shared by the depletion layers and the insulating film;
    wherein said first semiconductor region is of the first conductivity type and said fifth semiconductor region is of the first conductivity type.

2. A device according to claim 1, further comprising a third semiconductor region having an impurity concentration lower than that of said second semiconductor region and formed in the surface portion of said first semiconductor region.

3. A device according to claim 2, wherein said third semiconductor region is formed adjacent to or near said second semiconductor region.

4. A high breakdown voltage semiconductor device, comprising:
    a composite substrate obtained by directly bonding a high-resistance semiconductor substrate having an insulating film formed on at least one surface thereof to a semiconductor substrate, said insulating film being formed at an interface thereof;
    a first semiconductor region constituting part of said high-resistance semiconductor substrate and isolated from other regions by an isolating region;
    a second semiconductor region of a first conductivity type having an impurity concentration higher than that of said first semiconductor region and selectively formed in a surface portion of said first semiconductor region;
    a third semiconductor region of a first conductivity type having an impurity concentration lower than that of said second semiconductor region and formed in the surface portion of said first semiconductor region;
    a fourth semiconductor region of a second conductivity type having an impurity concentration higher than that of said first semiconductor region and formed in the surface portion of said first semiconductor region so as to be outside said third semiconductor region;
    a fifth semiconductor region formed on a bottom portion of said first semiconductor region, and having a dose of impurity atoms not more than $5 \times 10^{14}/cm^2$; and a sixth semiconductor region of a second conductivity type having an impurity concentration higher than that of said fifth semiconductor region and formed so as to extend from said fourth semiconductor region to said fifth semiconductor region, depletion layers being formed in said first, third and fifth semiconductor regions when a high voltage is applied between said second and fourth semiconductor regions and the applied voltage being shared by the depletion layers and the insulating film;

wherein said first semiconductor region is of the second conductivity type and said fifth semiconductor region is of the first conductivity type.

5. A high breakdown voltage semiconductor device, comprising:

a composite substrate obtained by directly bonding a high-resistance semiconductor substrate having an insulating film formed on at least one surface thereof to a semiconductor substrate, said insulating film being formed at an interface thereof;

a first semiconductor region constituting part of said high-resistance semiconductor substrate and isolated from other regions by an isolating region;

a second semiconductor region of a first conductivity type having an impurity concentration higher than that of said first semiconductor region and selectively formed in a surface portion of said first semiconductor region;

a fourth semiconductor region of a second conductivity type having an impurity concentration higher than that of said first semiconductor region and formed in the surface portion of said first semiconductor region so as to be outside said second semiconductor region;

a fifth semiconductor region formed on a bottom portion of said first semiconductor region, and having a dose of impurity atoms not more than $5 \times 10^{14}/cm^2$; and a sixth semiconductor region of a second conductivity type having an impurity concentration higher than that of said fifth semiconductor region and formed so as to extend from said fourth semiconductor region to said fifth semiconductor region, depletion layers being formed in said first, third and fifth semiconductor regions when a high voltage is applied between said second and fourth semiconductor regions and the applied voltage being shared by the depletion layers and the insulating film;

wherein a total amount of impurity per unit area of said fifth semiconductor region is in a range of $0.1 \times 10^{12}$ to $3 \times 10^{12}/cm^2$.

6. A device according to claim 5, further comprising a third semiconductor region having an impurity concentration lower than that of said second semiconductor region and formed in the surface portion of said first semiconductor region.

7. A device according to claim 6, wherein said third semiconductor region is formed adjacent to or near said second semiconductor region.

8. A device according to claim 6, wherein a total amount of impurity per unit area of said third semiconductor region is in said range of $0.1 \times 10^{12}$ to $3 \times 10^{12}/cm^2$.

9. A high breakdown voltage semiconductor device, comprising:

a composite substrate obtained by directly bonding a high-resistance semiconductor substrate having an insulating film formed on at least one surface thereof to a semiconductor substrate, said insulating film being formed at an interface thereof;

a first semiconductor region constituting part of said high-resistance semiconductor substrate and located from other regions by an isolating region;

a second semiconductor region of a first conductivity type having an impurity concentration higher than that of said first semiconductor region and selectively formed in a surface portion of said first semiconductor region;

a fourth semiconductor region of a second conductivity type having an impurity concentration higher than that of said first semiconductor region and formed in the surface portion of said first semiconductor region so as to be outside said second semiconductor region;

a fifth semiconductor region formed on a bottom portion of said first semiconductor region, and having a dose of impurity atoms not more than $5 \times 10^{14}/cm^2$; and a sixth semiconductor region of a second conductivity type having an impurity concentration higher than that of said fifth semiconductor region and formed so as to extend from said fourth semiconductor region to said fifth semiconductor region, said first and fifth semiconductor regions being depleted when a high voltage is applied between said second and fourth semiconductor regions;

wherein a p-n junction for element isolation is formed on a side surface of said first semiconductor region.

10. A device according to claim 9, further comprising a third semiconductor region having an impurity concentration lower than that of said second semiconductor region and formed in the surface portion of said first semiconductor region.

11. A device according to claim 10, wherein said third semiconductor region is formed adjacent to or near said second semiconductor region.

12. A high breakdown voltage semiconductor device, comprising:

a composite substrate obtained by directly bonding a high-resistance semiconductor substrate having an insulating film formed on at least one surface thereof to a semiconductor substrate, said insulating film being formed at an interface thereof;

a first semiconductor region constituting part of said high-resistance semiconductor substrate and isolated from other regions by an isolating region;

a second semiconductor region of a first conductivity type having an impurity concentration higher than that of said first semiconductor region and selectively formed in a surface portion of said first semiconductor region;

a fourth semiconductor region of a second conductivity type having an impurity concentration higher than that of said first semiconductor region and formed in the surface portion of said first semiconductor region so as to be outside said second semiconductor region;

a first semiconductor region formed on a bottom portion of said first semiconductor region, and having a dose of impurity atoms not more than $5 \times 10^{14}/cm^2$; and a sixth semiconductor region of a second conductivity type having an impurity concentration higher than that of said fifth semiconductor region and formed so as to extend from said fourth semiconductor region to said fifth semiconductor region, depletion layers being formed in said first, third and fifth semiconductor regions when a high voltage is applied between said second and fourth semiconductor region, and the applied voltage being shared by the depletion layers and the insulating film;

wherein a total amount of impurity per unit area of said fifth semiconductor region is in a range of $0.5 \times 10^{12}$ to $2.0 \times 10^{12}/cm^{-2}$.

13. A device according to claim 12, further comprising a third semiconductor region having an impurity concentration lower than that of said second semiconductor region and formed in the surface portion of said first semiconductor region.

14. A device according to claim 13, wherein said third semiconductor region is formed adjacent to or near said second semiconductor region.

* * * * *